US007065857B2

(12) United States Patent
Watanabe et al.

(10) Patent No.: US 7,065,857 B2
(45) Date of Patent: Jun. 27, 2006

(54) METHOD OF MANUFACTURING ELECTRONIC DEVICE

(75) Inventors: Miho Watanabe, Minamiashigara (JP); Hiroyuki Watanabe, Nakai-machi (JP); Chikara Manabe, Nakai-machi (JP); Masaaki Shimizu, Nakai-machi (JP)

(73) Assignee: Fuji Xerox Co., Ltd., Tokyo (JP)

( * ) Notice: Subject to any disclaimer, the term of this patent is extended or adjusted under 35 U.S.C. 154(b) by 308 days.

(21) Appl. No.: 10/370,703

(22) Filed: Feb. 24, 2003

(65) Prior Publication Data

US 2004/0041154 A1 Mar. 4, 2004

(30) Foreign Application Priority Data

Sep. 4, 2002 (JP) .............................. 2002-258885

(51) Int. Cl.
*H01S 4/00* (2006.01)
*G01R 31/28* (2006.01)

(52) U.S. Cl. ...................... 29/592.1; 29/593; 313/309; 445/49; 445/50; 438/20

(58) Field of Classification Search ............... 29/592.1, 29/593, 825–834; 313/309–311, 336, 351; 445/49–51, 24; 438/20, 125, 486; 257/737–738, 257/10
See application file for complete search history.

(56) References Cited

U.S. PATENT DOCUMENTS 5,346,683 A * 9/1994 Green et al. ............. 423/447.2
5,482,601 A * 1/1996 Ohshima et al. ............ 204/173
5,916,642 A * 6/1999 Chang ......................... 29/509
6,325,909 B1 * 12/2001 Li et al. ....................... 205/106
6,884,404 B1 * 4/2005 Anazawa et al. ......... 423/447.1
6,892,432 B1 * 5/2005 Nakayama et al. ........... 29/412
6,914,372 B1 * 7/2005 Akiyama et al. ........... 313/309
6,920,680 B1 * 7/2005 Wei et al. ................... 29/592.1
2004/0041154 A1 * 3/2004 Watanabe et al. ............. 257/77

OTHER PUBLICATIONS

Sander J. Tans et al.; "Room-Temperature Transistor Based on a Single Carbon Nanotube"; May 7, 1998; Nature vol. 393; pp. 49-52.
Philip G. Collins et al.; "Engineering Carbon Nanotubes and Nanotube Circuits Using Electrical Breakdown"; Apr. 27, 2001; Science vol. 292; pp. 706-709.
Stanley Pons et al.; "The Behavior of Microelectrodes"; Dec. 15, 1987; Analytical Chemistry vol. 59 No. 24; pp. 1391A-1396A and pp. 1398A-1399A.
M.S. Fuhrer et al.; "Crossed Nanotube Junctions"; Apr. 21, 2000; Science vol. 288; pp. 494.

* cited by examiner

*Primary Examiner*—Minh Trinh
(74) *Attorney, Agent, or Firm*—Oliff & Berridge, PLC

(57) ABSTRACT

The method of manufacturing an electric part including a matrix-shaped nonconductive base member, and a carbon nanotube group that is sealed within the nonconductive base member and includes at least one of a carbon nanotube and a plurality carbon nanotubes that are electrically connected to each other. According to the method, substantially only an end portion of the carbon nanotube or at least carbon nanotube contained in the plurality of carbon nanotubes may be exposed from one surface of the nonconductive base member, and an electrode may be connected to a side surface of at least one carbon nanotube included in the carbon nanotube group.

21 Claims, 19 Drawing Sheets

(a)

(b)

(c)

METHOD OF MANUFACTURING ELECTRONIC DEVICE

FIELD OF THE INVENTION AND RELATED ART STATEMENT

The present invention relates to an electric part which can be used as a rectifier, a sensor electrode, or the like and a method of manufacturing the electric part, and more particularly to an electric part using a carbon nanotube which is low in energy loss and has a novel availability and a method of manufacturing the electric part.

Up to now, because a single layer carbon nanotube exhibits a semiconductor characteristic, an attempt has been made to use the carbon nanotube as an electronic device, and a rectifier and a transistor have been manufactured by using the carbon nanotube by way of trial, and also announced (for example, refer to S. J. Tans et al., "Room-temperature transistor based on a single carbon nanotube", Nature, 1998, vol. 393, pp. 49–52, M. S. Fuhrer et al., "Crossed Nanotube Junctions", Science, vol. 288 (2000), p. 494). Also, there has been reported a technique by which only a single layer carbon nanotube having the semiconductor characteristic remains to manufacture a transistor (for example, refer to P. G. Collins et al., "Engineering Carbon Nanotubes and Nanotube Circuits Using Electrical Breakdown" Science, 2001, vol. 292, pp. 706–709).

An advantage obtained by the carbon nanotube used as an electronic element resides in that the conduction mechanism of the carbon nanotube is in a state where electrons are hardly scattered within a solid which is called "ballistic conduction" with the result that a heat is hardly generated even if a large amount of currents is allowed to flow in the electronic element. Also, since the diameter of the carbon nanotube is from about 1 nm to 20 nm, it is preferable that the carbon nanotube is used as a micro circuit element or electrode.

On the other hand, in an electrochemical biosensor which has been increasingly researched and developed in recent years, an electrode made of metal or carbon is employed. The metal used for the electrode is selected from platinum, nickel, copper, gold, or the like, and platinum is generalized for measurement of hydrogen peroxide. As the electrodes made of carbon, various electrodes such as a glassy carbon electrode, a graphite electrode, a carbon paste electrode, and a carbon fiber electrode have been developed and widely applicable. The carbon electrode contributes to the spread of a high-speed, high-performance, and high-pressure solution chromatography (HPLC) electrochemical detector (ECD).

On the contrary, a micro electrode is a generic name of electrodes that are μm level or smaller in size as compared with electrodes that are several mm to several cm and normally used for electrochemical measurement (for example, refer to S. Pons and M. Fleishmann, Analytical Chemistry, 1987, vol. 59, p. 1391A). When the micro electrode is used, the electrochemical measurement different from that in the case of using an electrode that is normal in size can be conducted. The micro electrode has the following features (a) to (e).

(a) The measurement can be conducted even in an electrolyte that is high in a solution resistance.
(b) The analysis of reaction can be simplified.
(c) Since a current response is high in speed, a high-speed reaction can be tracked.
(d) A high sensitivity can be measured.
(e) The information on an extremely limited region of an electrode surface is obtained.

However, in the case where the carbon nanotube is used as the electronic device, the most serious problem resides in that it is impossible to conduct wiring or processing at an arbitrary portion by a light exposing method as in the conventional semiconductor process because the carbon nanotube is made of a fiber material. In particular, since the diameter of the carbon nanotube is several nm, not the ultraviolet exposing method but the electron beam exposing method is required to be used in the patterning of the substrate wiring. However, the electron beam exposing method is unsuitable for the industrial mass production.

Also, since the carbon nanotube is of a carbon structural body, the carbon nanotube cannot be wet-etched by strong acid or strong alkali. When dry ion etching is conducted, a carbon nanotube surface (side surface) is damaged, resulting in a change in the conduction characteristic. There has been also known that the above-mentioned ballistic conduction is difficult to occur in the damaged carbon nanotube.

Another problem resides in that the carbon nanotube is of the metal type and the semiconductor type in the single-layer carbon nanotube, only the metal carbon nanotube has been known in a multi-layer carbon nanotube, an active electronic device cannot be manufactured unless the carbon nanotube has the semiconductor characteristic, and it is necessary that only the carbon nanotube having the semiconductor characteristic is separated and used. There has been proposed a manner in which a large amount of current is allowed to flow, and only the carbon nanotube having the semiconductor characteristic remains, but this manner is unsuitable for mass production.

From the above-mentioned viewpoint, there is desired a manufacturing technique of an electric device using the carbon nanotube which enables mass production not depending on the conventional light exposing technique.

On the other hand, as described above, the carbon fiber which is several μm in diameter is normally used as the carbon electrode, and it is desired to still more greatly improve the performance by further thinning the diameter.

SUMMARY OF THE INVENTION

The present invention has been made in view of the above-mentioned circumstances, and therefore provides an electric part which can be produced by using a carbon nanotube through a producing process which is excellent in an industrial productivity, and a method of manufacturing the electric part.

In more detail, the present invention provides an electric part that is available as a sensor electrode higher in performance and having a micro diameter which can be used for electrochemical measurement, or a rectifier which is low in energy loss, and a method of manufacturing the electric part. The above-mentioned electric part and the method of manufacturing the electric part are achieved by the present invention stated below.

That is, according to the present invention, an electric part includes: a nonconductive base matrix member; a carbon nanotube group that is sealed within the nonconductive base matrix member and includes one carbon nanotube or plural carbon nanotubes which are electrically connected to each other, in which substantially only an end portion of the one carbon nanotube or at least one carbon nanotube contained in the plural carbon nanotubes is exposed from one surface of the nonconductive base matrix member; and an electrode that is connected to a side surface of the at least one carbon nanotube contained in the carbon nanotube group.

In case of the electric part of the present invention, it is unnecessary to use a light exposing technique in the manufacturing method, and for example, a simple structure is provided such that the electric part can be mainly manufactured by forming the electrode through a simple vapor deposition method and merely exposing the end portion of the carbon nanotube through a mechanical cutting process. Therefore, this technique is excellent in the industrial productivity and enables mass production.

The electric part of the present invention can be used as the sensor electrode having a micro diameter as it is. Also, when a second electrode layer that is electrically connected with substantially only the exposed end portion of the carbon nanotube is formed on a surface of the nonconductive base matrix member from which the end portion of the carbon nanotube is exposed, the electric part can be used as the rectifier which is low in energy loss with the second electrode layer as a positive pole and the electrode as a negative pole (in the present specification, "electrode" merely called is directed to an electrode connected to the carbon nanotube at the side surface, and may be called "first electrode" for distinction from the second electrode layer).

In the case where the electric part of the present invention is manufactured by the method of manufacturing the electric part of the present invention which will be described later, the exposed end portion of the carbon nanotube becomes a cut surface.

In the electric part of the present invention, it is preferable that the volume resistance of the nonconductive base matrix member is from $1 \times 10^7$ Ωcm to $1 \times 10^{15}$ Ωcm, and it is preferable that a material of the nonconductive base matrix member is a resin material.

In the electric part of the present invention, it is preferable that the electrode (first electrode) and the second electrode layer are made of any one material selected from the group consisting of metal, semiconductor, and conductive organic high polymer, independently, and more specifically, it is preferable that the electrode and the second electrode layer are each made of any one material selected from the group consisting of Au, Pt, Ag, Si, GaAs, InP, GaN, polypyrrole, and polyaniline.

Also, in the electric part of the present invention, the electrode (first electrode) may be made of a metal material that can form a nonconductive oxide layer due to oxidation, for example, Al. In this case, it is possible to adopt a mode in which the end portion of the electrode is exposed from one surface of the nonconductive base matrix member together with the end portion of the carbon nanotube, and the exposed end portion of the electrode is formed of an oxide layer obtained by oxidizing the metal material.

On the other hand, a method of manufacturing an electric part according to the present invention includes: sealing a carbon nanotube group including one carbon nanotube or plural carbon nanotubes which are electrically connected to each other; forming an electrode which is electrically connected to a side surface of at least one carbon nanotube included in the carbon nanotube group; and cutting the at least one carbon nanotube included in the carbon nanotube group together with the nonconductive base member to obtain a cut surface.

In case of the method of manufacturing the electric part according to the present invention, the available electric part using the carbon nanotube can be manufactured only by forming an electrode layer, for example, through a simple vapor deposition method in the electrode layer forming process, forming the nonconductive base member, for example, through a general resin molding method in the sealing process, and exposing the end portion of the carbon nanotube through a mechanical cutting process in the cutting process, without including the manufacturing process using the light exposing technique. Therefore, the manufacturing method is excellent in the industrial productivity and enables mass production.

In the method of manufacturing the electric part according to the present invention, the nonconductive base member is formed at least of a sheet-shaped or plate-shaped nonconductive substrate and a nonconductive base member layer formed on the surface of the substrate, and the sealing process can include arranging the carbon nanotube group on the substrate surface, and forming the base member layer that covers and seals the overall carbon nanotube group on the substrate surface on which the carbon nanotube group is arranged. In the arranging process, when the carbon nanotube group is arranged by coating, for example, the dispersion solution of the carbon nanotube, the carbon nanotube group can be readily arranged in a state required by the present invention.

In the method of manufacturing the electric part according to the present invention, the electrode forming process can include forming the electrode on the substrate surface to a layer. Also, it is general that a cut portion in the cutting process is in a region where the electrode is not formed. However, in the case where the electrode is made of a metal material that can form a nonconductive oxide layer due to oxidation, the cut portion in the cutting process can be a region where the electrode is formed.

According to the method of manufacturing the electric part of the present invention, the electric part which can be used as the sensor having the micro diameter as it is can be manufactured, and when a second electrode layer forming process of forming the second electrode layer on the cut surface is further included subsequent to the cutting process, the electric part can be manufactured which is available as a rectifier having the second electrode layer as a positive pole and the electrode (first electrode) as a negative pole.

In the method of manufacturing the electric part of the present invention, it is preferable that the volume resistance of the nonconductive base member is from $1 \times 10^7$ Ωcm to $1 \times 10^{15}$ Ωcm, and it is preferable that a material of the nonconductive base member is a resin material. In the method of manufacturing the electric part of the present invention, it is preferable that the electrode (first electrode) and the second electrode layer are made of one material selected from the group consisting of metal, semiconductor, and conductive organic high polymer, independently, and more specifically, it is preferable that the electrode and the second electrode layer are each made of any one material selected from the group consisting of Au, Pt, Ag, Si, GaAs, InP, GaN, polypyrrole, and polyaniline.

It is preferable that the arranging process includes arranging the carbon nanotube group by coating a dispersion solution resulting from dispersing the carbon nanotube in a dispersion medium on a desired region and drying the dispersion solution. In this situation, the dispersion medium to be used may include water and/or alcohol. Also, the dispersion medium may include a surface active agent. In the cutting process in the method of manufacturing the electric part according to the present invention, it is preferable that a diamond knife or a sapphire knife is employed.

BRIEF DESCRIPTION OF THE DRAWINGS

Preferred embodiments of the present invention will be described in detail based on the following drawings, wherein:

These and other objects and advantages of this invention will become more fully apparent from the following detailed description taken with the accompanying drawings in which:

FIGS. 5A to 5C are enlarged cross-sectional views for explanation of an exposed state of a carbon nanotube, in which FIG. 5A shows a state in which only an end portion is strictly exposed, FIG. 5B shows a state in which the end portion of the carbon nanotube is slightly depressed from a surface X, and FIG. 5C shows a state in which the end portion of the carbon nanotube is slightly projected from the surface X, and a side surface thereof is slightly exposed therefrom.

FIGS. 6A to 6C are plan views showing modes in which the carbon nanotube group is arranged in accordance with the present invention, in which FIG. 6A shows a state in which the carbon nanotube group is roughly divided into two pieces, FIG. 6B shows a state in which a portion between an electrode and an exposed portion are bridged by a single carbon nanotube, FIG. 6C shows a state in which the portion between the electrode and the exposed portion are bridged by a single carbon nanotube and also bridged by plural carbon nanotubes.

DETAILED DESCRIPTION OF THE PREFERRED EMBODIMENTS

Hereinafter, a description will be given in more detail of preferred embodiments of an electric part and a method of manufacturing the electric part in accordance with the present invention with reference to the accompanying drawings.

[Electric Part of the Present Invention]

First Embodiment

First, a first embodiment will be described as an electric part useable as a sensor electrode of a micro-diameter in accordance with an embodiment of the present invention.

Figure 1:
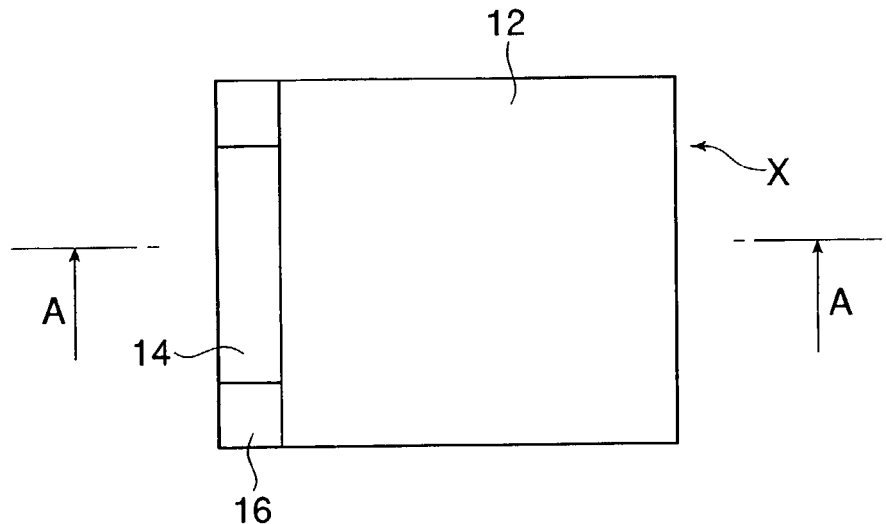
FIG. 1 is a plan view showing an electric part useable as a sensor electrode having a micro diameter in accordance with an embodiment of the present invention.
Figure 2:
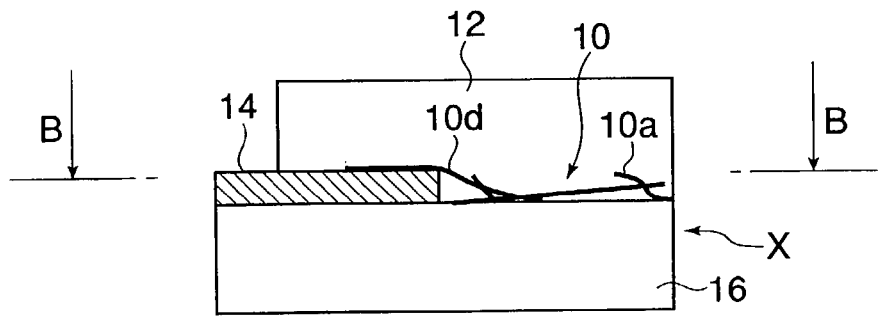
FIG. 2 is a cross-sectional view of the electric part taken along a line A—A of FIG. 1.
Figure 3:
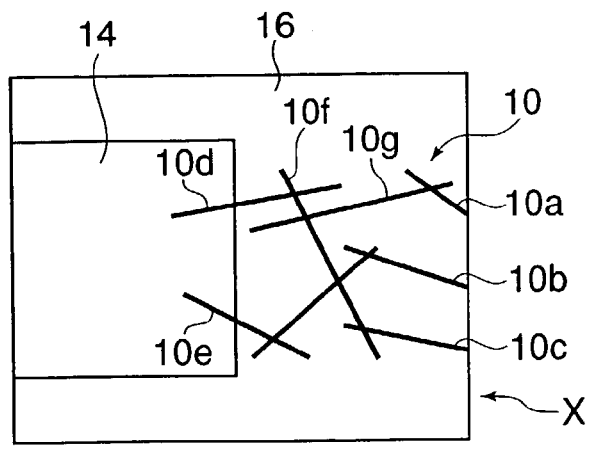
FIG. 3 is a cross-sectional view of the electric part taken along a line B—B of FIG. 2.

FIGS. 1 to 3 show an electric part in accordance with the first embodiment. In detail, FIG. 1 is a plan view of the electric part in accordance with this embodiment, FIG. 2 is a cross-sectional view taken along a line A—A of FIG. 1, and FIG. 3 is a cross-sectional view taken along a line B—B of FIG. 2. In the figures, reference numeral 10 denotes a carbon nanotube group which is made up of plural carbon nanotubes, 12 is a nonconductive base member layer, 14 is a thin-film electrode, and 16 is a nonconductive substrate. Both the cross-sectional views of FIGS. 2 and 3 are so drawn as to make all of the carbon nanotubes of the carbon nanotube group 10 visible for facilitation of explanation, but a part of the carbon nanotubes is hidden by the remaining base member layer 12 in the section A—A and the section B—B, in fact.

The carbon nanotube group 10 mounted on the substrate 16 is sealed by the base member layer 12. In detail, the arrangement is made such that the carbon nanotube group 10 is included in the interior of the matrix-shaped nonconductive base member which is made up of the base member layer 12 and the substrate 16. That is, the respective carbon nanotubes in the carbon nanotube group 10 are surrounded by the nonconductive base member except for the end portions thereof which will be described later.

Figure 4:
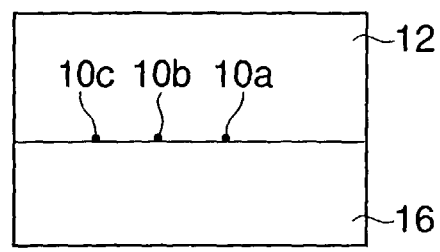
FIG. 4 is a side view of the electric part shown in FIGS. 1 to 3 when being viewed from a surface X side.

FIG. 4 shows a side view viewed from a surface X side in FIGS. 1 to 3. As shown in FIG. 4, the end portions of only three carbon nanotubes 10a, 10b, and 10c among the carbon nanotube group 10 are exposed from the surface X. A state of the exposed carbon nanotubes will be described in more detail. In this example, the carbon nanotube 10a among the exposed carbon nanotubes will be exemplified.

Figure 5:
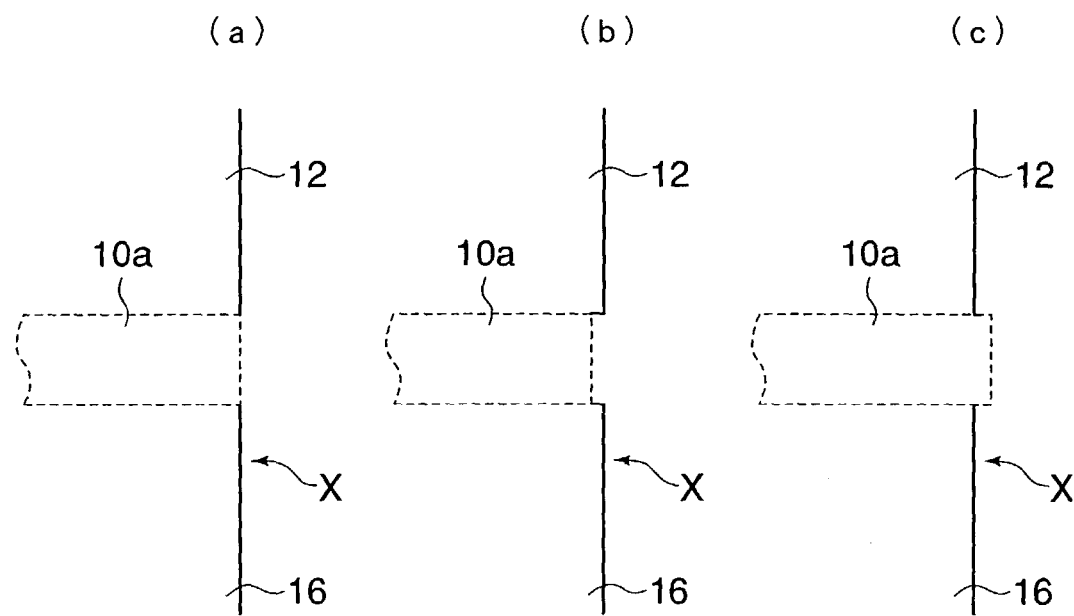

FIGS. 5A to 5C are enlarged cross-sectional views for explaining the exposed state of the carbon nanotube 10a. As shown in FIG. 5A, only the end portion of the exposed carbon nanotube 10a is exposed from one surface of the nonconductive base member which is made up of the base member layer 12 and the substrate 16. The structure in which only the end portion is exposed as described above is the subject matter of the present invention. The existence of the exposed end portion which becomes an extremely minute contact point can structure a minute detecting portion in the case where the electric part of the present invention is used, for example, as a sensor. Also, the existence of the exposed end portion can structure a minute contact with the second electrode layer in the case where the electric part of the present invention is used, for example, as a rectifier which will be referred to in an embodiment which will be described later, thereby exhibiting the excellent characteristic as the electric part of the present invention.

It should be noted that the structure in which only the end portion is strictly exposed as shown in FIG. 5A is not the requirement of the present invention. The carbon nanotube is a substance having an extremely micro diameter and length, and therefore, it is difficult to structure a state in which only the end portion is clearly exposed. Therefore, in the exposed carbon nanotube according to the present invention, even cases where the end portion of the carbon nanotube 10a is depressed from the surface X as shown in FIG. 5B, and where the end portion of the carbon nanotube 10a is slightly projected from the surface X, and a side surface thereof is slightly exposed therefrom as shown in FIG. 5C are involved in the concept that substantially only the end portion is exposed, and comes into the category of the present invention. Because the characteristics of the manufactured electric part are affected in accordance with the degree of the depression or exposed portion, it is desirable to make the state of the exposed end portion approach the state shown in FIG. 5A as much as possible.

On the other hand, only two carbon nanotubes 10d and 10e among the carbon nanotube group 10 are connected to the electrode 14 at side surfaces thereof. The connection at the side surfaces does not suffer from any problem if the carbon nanotube 10d and the electrode 14 are in physical contact with each other as shown in FIG. 2. However, in the present invention, if both the carbon nanotube 10d and the electrode 14 are electrically connected to each other, they may be not always physically connected to each other. Also, it is not required that a portion of the carbon nanotube which is connected to the electrode is in the vicinity of the end portion thereof if the portion is a side surface thereof.

Also, the positional relationship between the carbon nanotube and the electrode is arranged such that the carbon nanotubes 10d and 10e are put on the electrode 14 in this embodiment. However, various modes are applicable such that the carbon nanotubes 10d and 10e are so arranged as to get under the electrode 14, to interpose the electrode between the plural carbon nanotubes, to interpose the carbon nanotubes between two electrodes conversely, or the like.

The carbon nanotubes of the carbon nanotube group 10 are arranged such that at least one of the carbon nanotubes 10d and 10e which are connected to the electrode 14 at the side surfaces thereof and at least one of the carbon nanotubes 10a, 10b, and 10c having the exposed end portions are electrically rendered conductive. For example, the carbon nanotube 10d is rendered conductive to the carbon nanotube 10a through the carbon nanotubes 10f and 10g. That is, the carbon nanotubes 10d and 10f, the carbon nanotubes 10f and 10g, and the carbon nanotubes 10g and 10a are electrically connected to each other, respectively, and the carbon nanotube 10d and the carbon nanotube 10a are rendered conductive. The carbon nanotube 10d and the carbon nanotubes 10b and 10c are rendered conductive through other carbon nanotubes connected to each other.

The connection of the carbon nanotubes to each other does not suffer from any problem if they are not only in physical contact with each other, but also electrically connected to each other even though they are not in physical contact with each other as in the connection of the carbon nanotube and the electrode.

It is needless to say that the arrangement of the carbon nanotube group according to the present invention is not limited to this embodiment. A mode that satisfies the following three conditions (1) to (3) falls into the category of the present invention.

(1) Substantially only the end portion of at least one carbon nanotube is exposed from one surface of the nonconductive base member.

(2) At least one carbon nanotube is electrically connected to the electrode on the side surface thereof.

(3) The carbon nanotubes connected to the electrode at the side surface and the carbon nanotubes having the exposed end portion are identical with each other, and/or at least one of the former and at least one of the latter are rendered electrically conductive.

Figure 6:
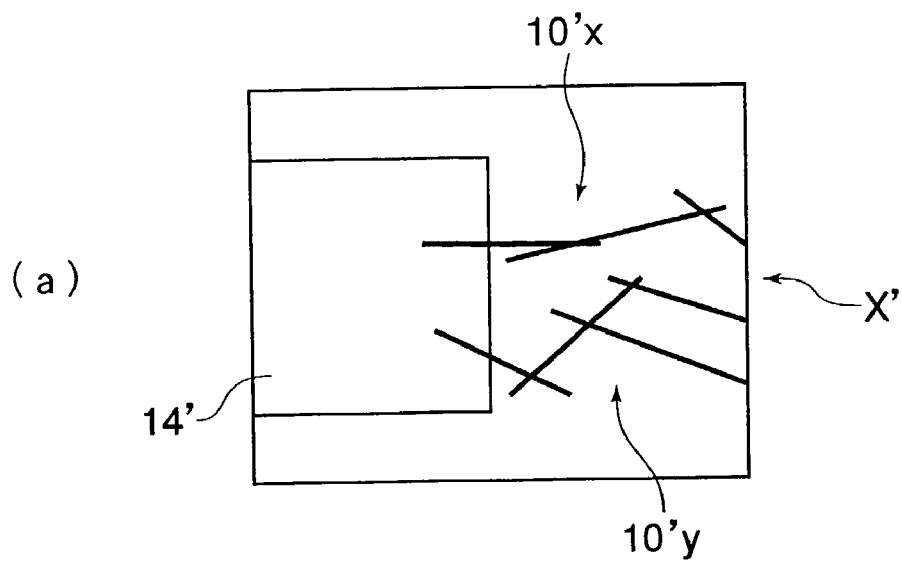
Figure 6:
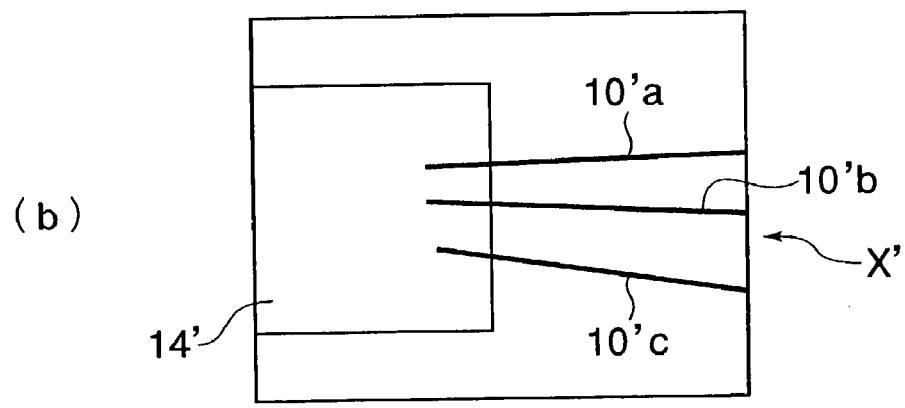
Figure 6:
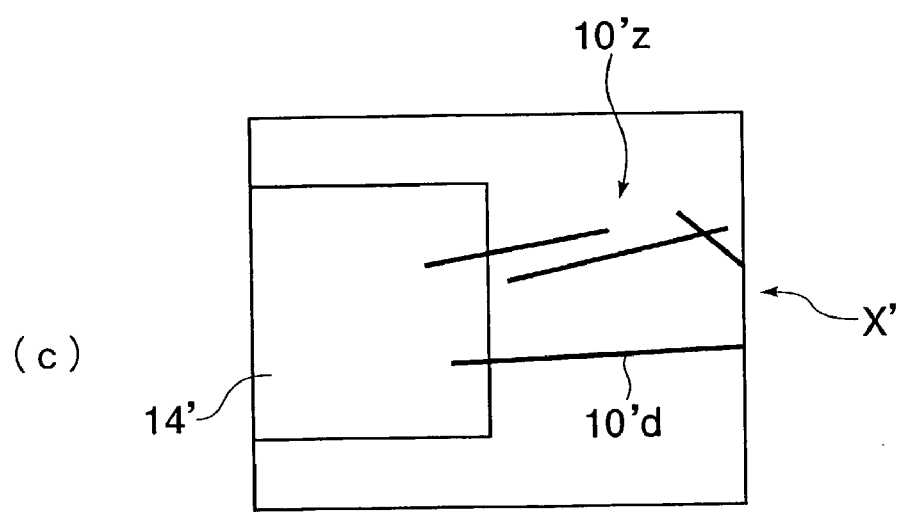

FIGS. 6A to 6C show several examples of specific modes. In this embodiment, the carbon nanotubes of the carbon nanotube group 10 are arranged in the form of a network, and all of the carbon nanotubes are connected to each other through any one of the other carbon nanotubes. As shown in FIG. 6A, it is possible that the carbon nanotube group 10 is roughly divided into a carbon nanotube group 10'x and a carbon nanotube group 10'y, and the carbon nanotube groups 10'x and 10'y each have the above relationships (1) to (3).

Also, in this embodiment and the mode shown in FIG. 6A, the carbon nanotube which is connected to the electrode at the side surface thereof and the carbon nanotube having the exposed end portion are formed of different carbon nanotubes. It is also possible that one end of one carbon nanotube is exposed from the surface X', and a side surface of the other end thereof is connected to the electrode 14' (that is, the carbon nanotube which is connected to the electrode at the side surface thereof and the carbon nanotube having the exposed end portion are identical with each other), as in the carbon nanotubes 10'a, 10'b, and 10 'c shown in FIG. 6B. In FIG. 6B, there is exemplified a state in which three carbon nanotubes structured as described above are arranged in parallel, but one carbon nanotube may be arranged instead. Similarly, it is recognized that those examples have the above-mentioned relationships (1) to (3). In the present specification, the arranged carbon nanotubes are generally called "carbon nanotube group", which includes one carbon nanotube.

In addition, as in the mode shown in FIG. 6C, a carbon nanotube group 10'z which is made up of plural carbon nanotubes and one carbon nanotube 10'd may have the above-mentioned relationships (1) to (3).

The electrode 14 is formed on the surface of the substrate 16 in a layer shape by, for example, plating or the like. However, in the present invention, the shape, material, structure, or the like of the electrode is not particularly limited if the electrode abuts against the side surface of at least one carbon nanotube among the carbon nanotube group and functions as an external terminal. Accordingly, there arises no problem even if the electrode is not formed in the layer shape.

A distance between the electrode 14 and the surface X is not particularly limited, but in the case where one carbon nanotube bridges a portion between the electrode 14 and the surface X, it is necessary to make the distance shorter than the length of the carbon nanotube. In the case where plural carbon nanotubes bridge the portion between the electrode 14 and the surface X, such a limit is not provided. When the case in which one carbon nanotube is provided and the case in which plural carbon nanotubes are provided are put together, from the viewpoint of their electric characteristic or the like of the obtained electric part, the distance between the electrode 14 and the surface X is selected from a range of from about 0.1 nm to 1 µm and preferably set within a range of from 1 nm to 10 nm.

The base member layer 12 that constitutes the nonconductive base member is so formed as to cover to seal the carbon nanotube group 10 and leave a part of the surface of the substrate 16 remaining so that a part of the electrode 14 is exposed and the surface X is formed together with the substrate 16. The part of the exposed electrode 14 becomes the external terminal.

The electric part according to the above-mentioned embodiment functions as the micro-diameter sensor electrode which can be used for electrochemical measurement and is extremely high in performance. The micro electrode used in the field normally employs a carbon fiber which is several µm in diameter, while in the sensor electrode that uses the carbon nanotube in accordance with this embodiment, a diameter of a portion that functions as the electrode (which is directed to not the electrode which is a structural element of the present invention but an electrode of a portion which is in contact with an external portion as the sensor) becomes a diameter of the carbon nanotube to be used, that is, 0.3 nm to 100 nm (in particular, preferably 10 nm to 20 nm) which extremely improves the performance. Since the diameter of the portion that functions as the electrode is small, the sensor electrode can implement the film potential in vivo as a needle.

Next, the details of the respective structural elements will be described.

(Carbon Nanotube)

The carbon nanotube is generally directed to a hexagonal network graphen sheet of carbon forming a tube in parallel with the tube axis. The carbon nanotubes are further classified into a structure having one graphen sheet which is called "single-layer nanotube (single wall carbon nanotube), and a structure having multiple graphen sheets which is called" multi-layer carbon nanotube (multi-wall carbon nanotube). Which kind of structure of the carbon nanotube is obtained is determined to some degree in accordance with a synthesizing method or conditions.

In the present invention, the carbon nanotube which is a primary structural element may be formed of the single-layer carbon nanotube or the multi-layer carbon nanotube having two layers or more.

Also, there can be used in the present invention as the carbon nanotube, the carbon nanotube which is not strictly shaped in a tube, such as a single-layer carbon nanotube which is the variety of the single-layer carbon nanotube (a horn type nanotube which continuously expands the diameter from one end portion toward the other end portion), a carbon nanocoil (a coil type nanotube which is spirally shaped as a whole), a carbon nanobeads (a nanotube that is so shaped as to have a tube in the center thereof which penetrates spherical beads made of amorphous carbon or the like), a cup stack type nanotube, a carbon nanohorn, or a carbon nanotube an outer periphery of which is covered with amorphous carbon.

In addition, a carbon nanotube where some material is included in the carbon nanotube such as a metal inclusion nanotube where a metal or the like is included in the carbon nanotube, or a peapod nanotube where fullerene or metal inclusion fullerene is included in the carbon nanotube can be also used as the carbon nanotube in the present invention.

As described above, in the present invention, even any kind of carbon nanotube such as the variety of the general carbon nanotube or the carbon nanotube which is subjected to various modifications in addition to the general carbon nanotube can be used from the viewpoint of their electric characteristic or the like without any problems. Therefore, the concept of the carbon nanotube defined in the present invention includes all of the above-mentioned structures.

The synthesis of those carbon nanotubes can be conducted even by any method of the arc electric discharge method, the laser ablation method and the chemical vapor deposition method which have been known up to now, which are not limited in the present invention. Among those methods, the arc electric discharge method in a magnetic field is preferable from the viewpoint that a high-purity carbon nanotube can be synthesized.

It is preferable that the diameter of the carbon nanotube to be used is set to from 0.3 nm to 100 nm. When the diameter of the carbon nanotube exceeds the above range, the synthesis is difficult, and the cost performance is not preferable.

The upper limit of the diameter of the carbon nanotube is set more preferably to 30 nm or less, and most preferably to 20 nm or less.

On the other hand, the lower limit of the diameter of the carbon nanotube is generally about 0.3 nm from the structural viewpoint. However, because there is a case in which when the diameter of the carbon nanotube is too thinned, the yield at the time of synthesizing becomes low which is not preferable, the lower limit of the diameter of the carbon nanotube is set more preferably to 1 nm or more, most preferably to 3 nm or more, and particularly preferably to 10 nm or more.

It is preferable that the length of the carbon nanotube to be used is set to a range of from 0.1 µm to 1 mm. When the length of the carbon nanotube exceeds the above range, it is not preferable from the viewpoint of the costs because the synthesis becomes difficult or a specific method for synthesizing is required, while when the length of the carbon nanotube is less than the range, it is not also preferable from the viewpoint that it is difficult to arrange the carbon nanotube group as has already been described above. The upper limit of the length of the carbon nanotube is set more preferably to 100 µm or less, and the lower limit thereof is set more preferably to 1 µm or more.

The end portion of the carbon nanotube is sealed in a state where the graphen sheet goes around the end portion thereof in a state where the synthesis is maintained. Therefore, the end portion of the carbon nanotube having the exposed end portion may be sealed with the graphen sheet, but in the case where the carbon nanotube is manufactured by the method of manufacturing the electric part in accordance with the present invention as will be described later, the carbon nanotube is cut halfway, and the cut surface of the carbon nanotube is exposed.

The number of carbon nanotubes that constitutes the carbon nanotube group may be one or plural. In order to further enhance the productivity, it is preferable that the number of carbon nanotubes is larger to some extent. However, that the number of carbon nanotubes increases to such an amount that the carbon nanotube group becomes a lump as a whole is not preferable because a gap between the respective nanotubes may occur when the carbon nanotubes are sealed with a nonconductive base member although depending on the manufacturing method.

(Nonconductive Base Member)

It is general that the nonconductive base member according to the present invention is made up of a substrate and a base member layer due to manufacturability. It is needless to say that the nonconductive material is made up of only a portion corresponding to the base member layer.

The base member layer that constitutes a part of the nonconductive base member according to the present invention can be used particularly without any problems if the base member layer is made of the nonconductive material, and may be made of organic material or inorganic material. The nonconductivity does not require a complete insulating material, but may have the conductivity of the degree which is generally regarded as a semiconductive material. The volume resistance as the nonconductive base member is set preferably to a range of from $1 \times 10^7$ Ωcm to $1 \times 10^{15}$ Ωcm, and more preferably to a range of from $5 \times 10^7$ Ωcm to $1 \times 10^{12}$ Ωcm.

It is preferable that the nonconductive base member is made of a resin material from the viewpoints of the molding property, the machining property, the precision property, and so on. The use of the resin material enables the nonconductive base member to be formed readily and with high precision by a conventionally known method such as injection molding or a layer formation due to coating and drying.

Specific materials available as the material of the nonconductive base member may be selected from inorganic materials such as silicon oxide, silicon nitride, silicon oxynitride, titanium oxide, niobium oxide, lithium niobate, strontium titanium, or diamond, various resin materials such as an epoxy resin, polyimide, polyamide, polyamide-imide, polyethylene, polypropylene, polyvinyl chloride, polyvinylidene chloride, an acrylate resin, a polycarbonate resin, a fluorocarbon resin, an amide resin, polyethylene terephthalate, polyurethane, polystyrene, polyacetal, a silicone resin, or a Teflon resin, or other organic materials from the viewpoints of an external air shielding function or a mechanical protecting function.

The substrate that constitutes a part of the nonconductive base member in the present invention can be used particularly without any problems if the base member is made of the nonconductive material as with the base member layer, and the preferable mode, the volume resistance, and so on are identical with those described with reference to the nonconductive base member.

The nonconductive base member used as the substrate preferably has a high strength of some degree since the nonconductive base member plays the role of retaining the electrode and the carbon nanotube group during the manufacturing of the electric part. Specifically, the nonconductive base member may be selected from, for example, polyimide, polyamide, polyamide-imide, an epoxyresin, a Teflon resin, a silicone resin, or the like. The same material as the base member layer may be preferably used for the nonconductive base member, but a different material from the base member layer may be used without any problems.

The thickness of the substrate is not particularly limited without any problem if the substrate is shaped in a sheet or a plate, but is set preferably to a range of from 1 µm to 100 µm from the viewpoint of workability. Also, the thickness of the overall nonconductive base member including the base member layer is selected from a range of from about 10 µm to 5 mm although the thickness depends on the intended purpose of the obtained electric part or the environments under which the electric part is used, and is not generally limited.

In this embodiment, a mode in which the structural element of the nonconductive base member is divided into the substrate and the base member layer is exemplified. However, in the present invention, the substrate and the base member layer may be made of the same material and integrally molded, or it is possible that only the base member layer is molded without the substrate, and the carbon nanotube is sealed therein to structure the nonconductive base member, depending on the manner of arranging the carbon nanotube or the electrode.

(Electrode)

The electrode (first electrode) according to the present invention can be made of the conventionally known material without any problems and any limits if the material has the conductivity, and may be made of an organic material or an inorganic material. The material available as the electrode can be any material selected from the group consisting of metal, semiconductor, and conductive organic high polymer, and more specifically, may be preferably any material selected from the group consisting of Au, Pt, Ag, Si, GaAs, InP, GaN, polypyrrole, and polyaniline. Those materials maybe used individually, but it is preferable that two or more materials are used, or a mixture of one or more of those materials and another conductive material such as metal is used. Those materials are excellent in conductivity and high in workability and stability, and used as the electrode of the electronic device up to now.

Also, the electrode (first electrode) according to the present invention can be made of a metal material that can form a nonconductive oxide layer through oxidation. In this case, the end portion of the first electrode is exposed from one surface of the nonconductive base member together with the end portion of the carbon nanotube, and the exposed end portion of the electrode is formed of an oxide layer resulting from oxidizing the metal material, to thereby structure an electric part in which on the one surface of the nonconductive base member from which the end portion of the first electrode and the end portion of the carbon nanotube are exposed, the exposed end portion of the electrode which is the oxide layer resulting from oxidizing the metal material and the nonconductive base member become in an insulating surface state, and only the end portion of the carbon nanotube is exposed in a conductive state. The details of this structure will be described in more detail with reference to "Method of Manufacturing an Electric Part according to the Present Invention" which will be described later.

The metal material that can form the nonconductive oxide layer through oxidation is a metal material that can form the nonconductive oxide layer by coming in contact with atmospheric air or conducting a known oxidizing processing regardless of the ease of oxidation, but preferably a metal material that can readily form the oxide layer by coming in contact with the atmospheric air. Specifically, there is a material that exhibits ionization tendency, for example, which is equal to or higher than Zn as an ionization series. In particular, Al is preferable.

As described above, in the present invention, the electrode is not required to be formed into a layer, but in the case where the electrode is formed into a layer, a thickness of the electrode is generally selected from a range of from 0.1 to 100 μm, and preferably selected from a range of from 1 to 30 μm.

Second Embodiment

Next, a second embodiment will be described as an electric part useable as a rectifier according to an embodiment of the present invention.

Figure 7:
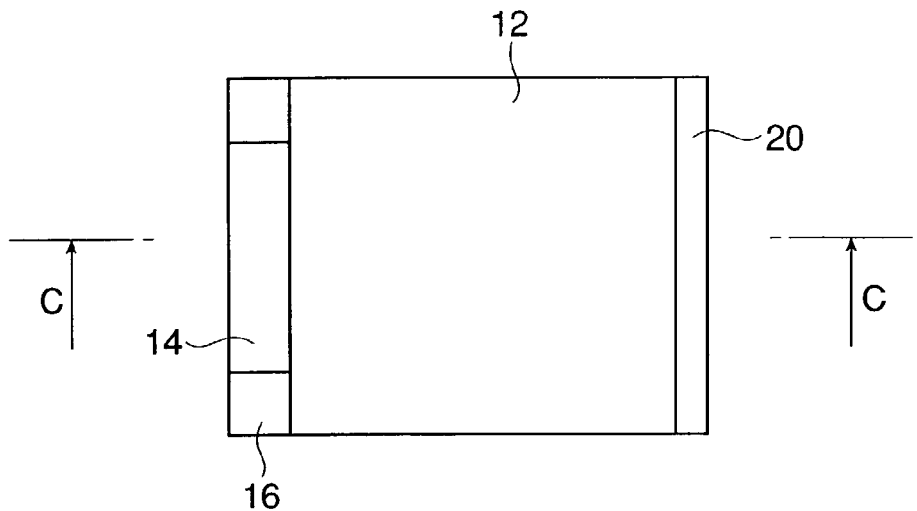
FIG. 7 is a plan view showing an electric part useable as an extremely minute rectifier in accordance with another embodiment of the present invention.
Figure 8:
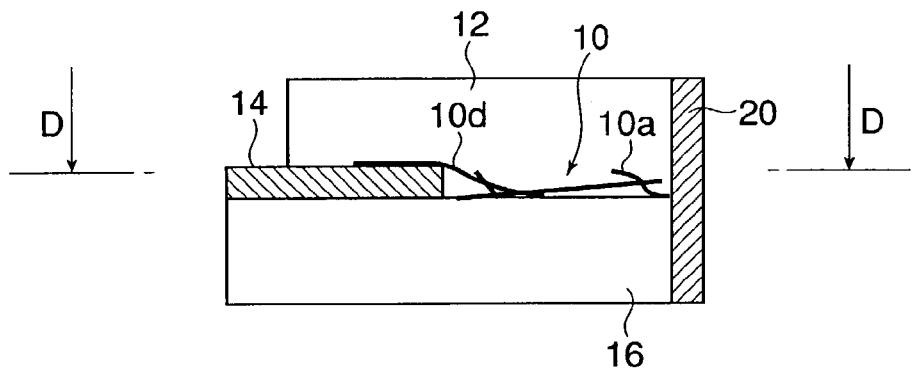
FIG. 8 is a cross-sectional view of the electric part taken along a line C—C of FIG. 7.
Figure 9:
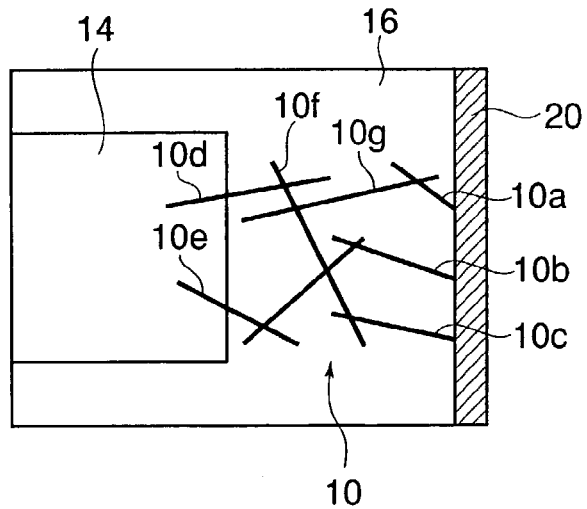
FIG. 9 is a cross-sectional view of the electric part taken along a line D—D of FIG. 8.

FIGS. 7 to 9 show an electric part in accordance with the second embodiment. In more detail, FIG. 7 is a plan view showing an electric part in accordance with this embodiment, FIG. 8 is a cross-sectional view taken along a line C—C of FIG. 7, and FIG. 9 is a cross-sectional view taken along a line D—D of FIG. 8. The electric part according to this embodiment is different from the electric part of the first embodiment only in that a second electrode layer 20 which is formed into a layer is formed on one surface (the surface X in FIGS. 1 to 3) of the electric part device of the first embodiment. The functions, preferred modes, arrangement, material, and so on of the respective structural elements are basically identical with those of the first embodiment. Therefore, in FIGS. 7 to 9, the members having the same functions as those of the first embodiment are designated by the same reference symbols as those in FIGS. 1 to 3, and their descriptions will be omitted. Hereinafter, only the structure, the operation, and the advantages different from those of the first embodiment will be described. Both of the cross-sectional views of FIGS. 8 and 9 are so drawn as to make all of the carbon nanotubes of the carbon nanotube group 10 visible for facilitation of explanation, as in FIGS. 2 and 3.

The second electrode layer 20 is shaped in a layer on an overall surface from which the end portions of three carbon nanotubes 10a, 10b, and 10c are exposed. As described in the first embodiment, the surface on which the second electrode layer 20 is formed later is in a state where substantially only the end portions of the carbon nanotubes 10a, 10b, and 10c are exposed from the surface. For that reason, the second electrode layer 20 is electrically connected to substantially only the end portions of the carbon nanotubes 10a, 10b, and 10c. As to the electric connection of the second electrode layer 20 to substantially only the end portions of the carbon nanotubes 10a, 10b, and 10c, the respective modes shown in FIGS. 5A to 5C are assumed, and the strict electric connection to only the end portion is not required by the present invention. Also, the connection manner may be not always directed to physical contact if both of the second electrode layer and the carbon nanotubes are electrically connected to each other.

The electric part according to this embodiment as described above is schematically shown in FIG. 10. That is, substantially only the end portion of at least one carbon nanotube 10"b within the carbon nanotube group is electrically connected to the second electrode layer 20, and at least one carbon nanotube 10"a within the carbon nanotube group is electrically connected to the electrode (first electrode) 14 at the side surface. Also, as a state between the carbon nanotubes 10"a and 10"b which is omitted in FIG. 10, there are two states consisting of a state in which those carbon nanotubes are integrated into one as they are (that is, those carbon nanotubes are both ends of the identical carbon nanotube), and a state in which those carbon nanotubes are arranged directly or through another carbon nanotube so that those carbon nanotubes are electrically rendered conductive to each other. It is needless to say that both of those states may be included in one electric part.

The electric part according to this embodiment functions as a rectifier with the second electrode 20 as a positive pole and the electrode (first electrode) 14 as a negative pole which is low in energy loss.

Although a distance between the electrode 14 and the second electrode layer 20 is not particularly limited, it is necessary to make the distance shorter than the length of the carbon nanotube in the case where one carbon nanotube bridges the portion between the electrode 14 and the second electrode layer. 20. There is no limit in the case where plural carbon nanotubes bridge the portion there between. This is identical with the first embodiment. In this embodiment, since the obtained electric part is a rectifier, it is necessary to study the distance in question from the viewpoint of the electric characteristic or the like as the rectifier, and when the case in which one carbon nanotube is provided and the case in which plural carbon nanotubes are provided are put together, the distance between the electrode 14 and the second electrode layer 20 is selected from a range of from about 10 nm to 500 μm, and preferably selected from a range of from 100 nm to 10 μm.

The second electrode layer according to the present invention is not limited if the second electrode layer has the conductivity, can be made of a known material without any problems, and may be made of an organic material or an inorganic material. The material useable as the second electrode layer may be any material selected from the group consisting of metal, semiconductor, and conductive organic high polymer. More particularly, it is preferable that the material of the second electrode layer is any material selected from the group consisting of Au, Pt, Ag, Si, GaAs, InP, GaN, polypyrrole, and polyaniline. Those materials are preferably use individually, but the combination of two or more materials, and the mixture of one or more of those materials and another conductive material such as metal may be preferably used for the second electrode layer. Those materials are excellent in conductivity, and high in workability and stability, and used as an electrode of an electronic device up to now.

The thickness of the second electrode layer according to the present invention is generally selected from a range of from 20 nm to 10 µm, and preferably selected from a range of from 0.1 to 1 µm. A region in which the second electrode layer is formed is an overall surface from which the end portions of the carbon nanotubes 10a, 10b, and 10c are exposed in this embodiment. However, the present invention does not require that the second electrode layer are thus formed on the entire surface, but may be formed in at least a region of the subject surface from which the end portions of the carbon nanotubes are exposed.

[Method of Manufacturing an Electric Part according to the Present Invention]

The electric parts according to the respective embodiments of the present invention as described above have no limit in the manufacturing method, but can be readily manufactured by the method of manufacturing the electric parts according to the present invention.

The method of manufacturing the electric part according to the present invention includes a sealing process, an electrode layer forming process, and a cutting process as essential processes, and the electric part according to the above-mentioned first embodiment is manufactured through only those processes. Also, the electric part according to the above-mentioned second embodiment is manufactured by conducting the second electrode layer forming process subsequent to the cutting process.

The electrode layer forming process and the sealing process among those processes may be replaced in order, the electrode layer forming process may be conducted during the sealing process or during or after the cutting process.

Hereinafter, some examples of the method of manufacturing the electric part according to the present invention will be described in detail for each of those processes. Because the structural elements per se of the electric part are identical with the electric part of the present invention, the description of the detailed structure and preferred modes will be omitted except for structural elements specific to the manufacturing method. Also, in the respective drawings used for the following manufacturing examples, the member having the same function is designated by reference symbol obtained by adding "1" to the third digit of the corresponding reference symbols in the respective drawings used in the above-mentioned embodiments (for example, the carbon nanotube group is designated by 10 in the above-mentioned embodiments, and 110 in the following examples).

FIRST MANUFACTURING EXAMPLE

<Electrode Layer Forming Process>

In the method of manufacturing the electric part according to the present invention, the electrode layer forming process is directed to a process of forming an electrode for conducting electric connection with a side surface of at least one carbon nanotube included in the carbon nanotube group. A first example is one example in which the electrode layer forming process is conducted prior to the sealing process.

Figure 11:
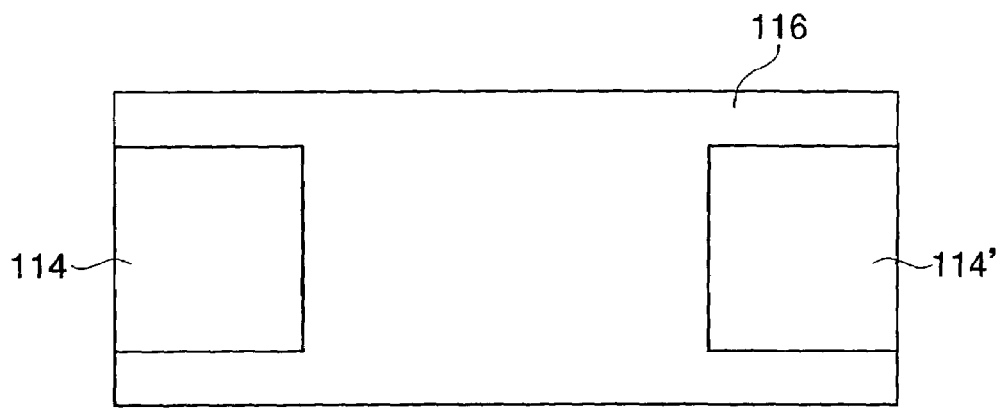
FIG. 11 is a plan view showing a state in which an electrode layer forming process has been conducted in a method of manufacturing an electric part in accordance with one example of the present invention.

FIG. 11 is a plan view showing a state in which two electrode layers are formed on a substrate surface through the electrode layer forming process. As shown in FIG. 11, in this example, electrodes 114 and 114' are disposed in given regions on a surface of a slightly slender and rectangular substrate 116 from both ends thereof along its longitudinal direction.

The distance between the electrodes 114 and 114' may be so designed as to provide a desired distance as a distance between the electrode layer and the surface from which the end portion of the -carbon nanotube is exposed because the electric part is manufactured by cutting the middle portion of the electrodes 114 and 114' in the cutting process which will be described later. As described with reference to the cutting process which will be described later, because there is a case where the subject surface is further shaved or ground after the cutting process, it is preferable that a loss in weight due to the shaving or grinding is taken into account.

The electrodes 114 and 114' can be formed by depositing a metal, for example, gold or platinum (in particular, noble metal) The forming method is not particularly limited in any materials, and the electrodes can be formed in desired shape and thickness by appropriately selecting various methods which have been known up to now. For example, in order to form a wiring of the printed circuit board, the method which has been used up to now or the like can be adopted.

As described above, the electrode layer forming process may be conducted after the sealing process, or after arranging the carbon nanotubes through an arranging process during the sealing process in advance as will be described later. Also, the electrode layer forming process may be conducted after the cutting process as shown in a second manufacturing example which will be described later.

<Sealing Process>

In the method of manufacturing the electric part according to the present invention, the sealing process is directed to a process of sealing the carbon nanotube group including one carbon nanotube or plural carbon nanotubes which are electrically connected to each other in the nonconductive base member. In the present invention, the sealing process may be a process finally defined as described above, but in this example, the sealing process consisting of the arranging process and a molding process is exemplified.

(Arranging Process)

The arranging process is directed to a process of arranging the carbon nanotube group including one carbon nanotube or plural carbon nanotubes which are electrically connected to each other on the substrate surface.

In particular, in this example, the carbon nanotube group including one or plural carbon nanotubes is arranged on the substrate surface such that at least one carbon nanotube is brought in contact with the electrode at a side surface thereof, a carbon nanotube or its portion exists in a region where no electrode layer is formed, and the carbon nanotube that is brought in contact with the electrode layer and the carbon nanotube or its portion which exists in a region where no electrode layer is formed become in a contact state.

The contact of the carbon nanotube with the electrode layer at a side surface thereof in the present application means the arrangement of both the electrode layer and the carbon nanotube which can have a relationship of the electric connection as described above, and does not require the complete physical contact of the electrode layer and the carbon nanotube. However, the physical contact is preferable because the relationship of the electric connection is surely satisfied.

In the manner of arranging the carbon nanotube group, for example, the individual carbon nanotubes can be manipulated one by one so as to be arranged at desired positions. However, because the carbon nanotube is extremely thinned, the individual manipulations are difficult, and the productivity is not so high.

Therefore, as the manner of arranging the carbon nanotube group, a method is preferable in which the dispersion solution resulting from dispersing the carbon nanotubes into a dispersion medium is coated on a desired region and dried to arrange the carbon nanotube group. Through this method, the carbon nanotube group can be simply arranged in a state where the carbon nanotube is in contact with the electrode layer at the side surface thereof.

The dispersion medium of the carbon nanotube is not particularly limited, and because the carbon nanotube is organic solvent insoluble, any organic or inorganic solution can be used, and various additive agents can be added to the dispersion medium. The particularly preferable dispersion medium is water, alcohol (particularly, methanol, ethanol, isopropanol, n-propanol, or the like), or a mixture of those materials, which are preferable from the viewpoint of the treatment property, a low environment load, or the like.

The additive agent which can be added to the dispersion medium may be a surface active agent, a dispersion coadjuvant, a dispersion stabilization agent, various ions, a viscosity adjuster, or the like, and a conventional agent can be used for the additive agent. Among them, the surface active agent is preferable because by addition of the surface active agent, the dispersion stability of the carbon nanotube is improved, and the dispersion agent is liable to be adapted to a surface to be coated on due to the surface tension of the dispersion solution is lowered, and because the stability of the electric characteristic of the device is hardly lowered.

The amount of addition of the carbon nanotube into the dispersion medium is not particularly limited, and may be appropriately set in association with the amount of carbon nanotubes to be arranged and the dispersion stabilization agent. In general, it is preferable from the viewpoint of the electric characteristic that the large end portion of the carbon nanotube is exposed and brought in contact with the first electrode at the side surface thereof, and the higher-concentration dispersion solution is also advantageous in a given arrangement. Therefore, it is preferable that the concentration of the dispersion solution is as high as possible. However, when the concentration is too high, there is a case in which the arranged carbon nanotube group becomes high in density and the carbon nanotube group becomes a lump as a whole. Therefore, the too high concentration is not preferable. In the case where the carbon nanotube group is caused to be a lump as a whole, there is a possibility that it is difficult to insert the material of the nonconductive base member layer into the gaps between the respective carbon nanotubes in the molding process which will be described later, and the gaps occur even after molding.

Therefore, there is a preferred range of the amount of addition of the carbon nanotubes into the dispersion medium, but the preferred range cannot be generally defined because it actually depends on the kind of dispersion medium to be used, and the length, the diameter or the like of the carbon nanotubes. Roughly, the amount of the addition of the carbon nanotubes is selected from a range of from 0.01 to 10 mass %. For example, in the case where the single-layer carbon nanotube whose average length is in a range of from 100 nm to 1 μm and whose diameter is in a range of from 1 to 1 nm is dispersed, it is preferable that the amount of addition of the carbon nanotubes is set to a range of from 0.05 to 0.5 mass %.

The method of coating the dispersion solution thus obtained in a desired region is not particularly limited, but it is sufficient that the distance between the electrodes 114 and 114' is extremely short in FIG. 11, and one droplet that has dropped down is appropriately developed as occasion demands. In the present invention, the work of only dropping down the droplet is also included in the concept of the coating. It should be noted that the droplet that has dropped down may be developed by a squeegee, a spatula, or the like, the dispersion solution may be sprayed by a spray or the like, or the coating work such as coating may be literally conducted by a conventionally known means.

Figure 12:
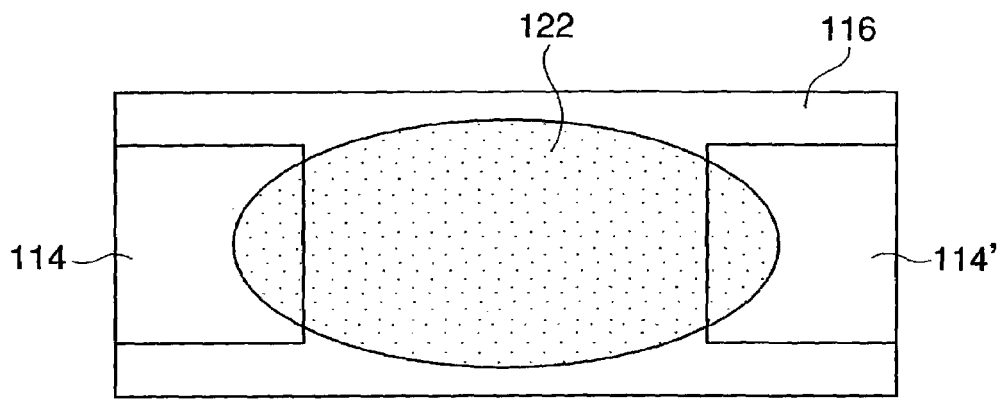
FIG. 12 is a plan view showing a state in which a carbon nanotube dispersion solution is coated in an arranging process in a method of manufacturing an electric part in accordance with one example of the present invention.

FIG. 12 is a plan view showing a state in which the dispersion solution is coated on a desired region. As shown in FIG. 12, in this example, the dispersion solution 122 in which the carbon nanotubes are dispersed in the dispersion medium is so coated as to put on both of the electrodes 114 and 114', and bridges a portion between those electrodes.

Figure 13:
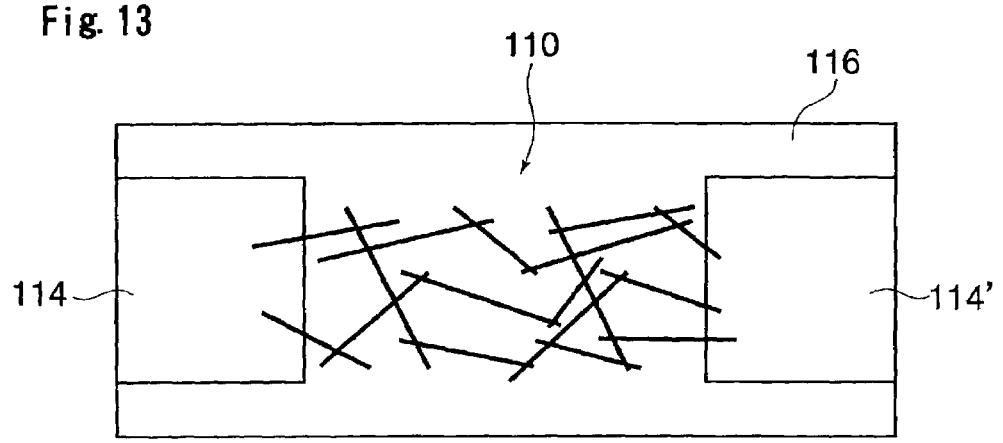
FIG. 13 is a plan view showing a state in which the arranging process has been conducted in a method of manufacturing an electric part in accordance with one example of the present invention.

When the dispersion solution is further dried from a state shown in FIG. 12 to volatilize the dispersion medium component in the dispersion solution 122, as shown in FIG. 13, the carbon nanotube group 110 contained in the dispersion solution 122 is arranged between the electrodes 114 and 114'. The drying method may be a heating dry or a natural dry.

The carbon nanotube group 110 made up of one or plural carbon nanotubes can be arranged on the surface of the substrate 116 by thus conducting the arranging process by using the dispersion solution such that at least one carbon nanotube is in contact with the electrode 114, 114' at a side surface thereof, the carbon nanotube or its portion exists in a region where the electrode 114, 114' is not formed, and the carbon nanotube that is in contact with the electrode 114, 114' and the carbon nanotube or its portion which exists in the region where the electrode 114, 114' is not formed become in a contact state.

In the case where the arranging process is conducted prior to the electrode layer forming process, the carbon nanotube group 110 is arranged taking into account the positions of the electrodes 114 and 114' that are formed through the electrode layer forming process which will be conducted later. Therefore, in the case where the arranging process is conducted by using the dispersion solution, the region on which the dispersion solution is coated may be determined supposing the position of the electrode layer which has not yet been formed.

(Molding Process)

The molding process is directed to a process of molding the nonconductive base member layer that covers to seal the whole carbon nanotube group.

Figure 14:
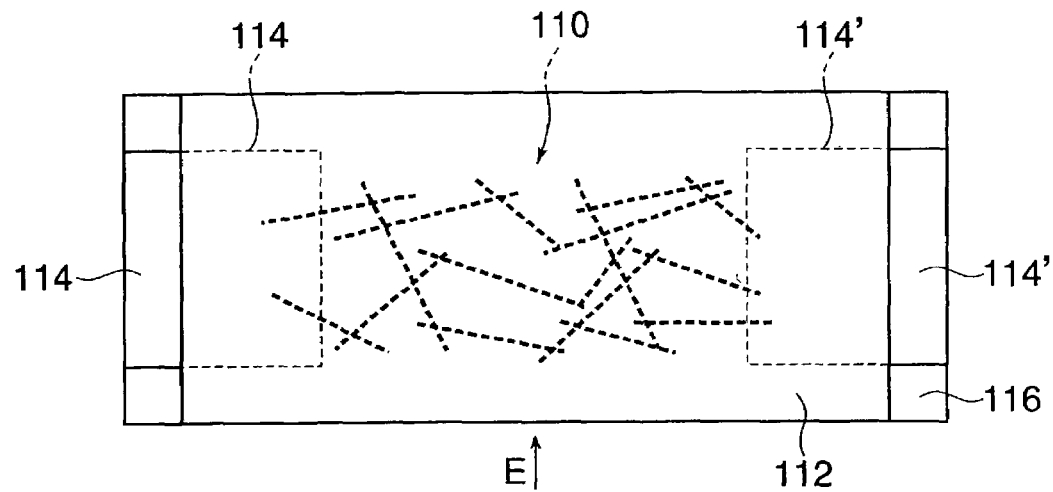
FIG. 14 is a plan view showing a state in which a sealing process has been conducted in a method of manufacturing an electric part in accordance with one example of the present invention.
Figure 15:
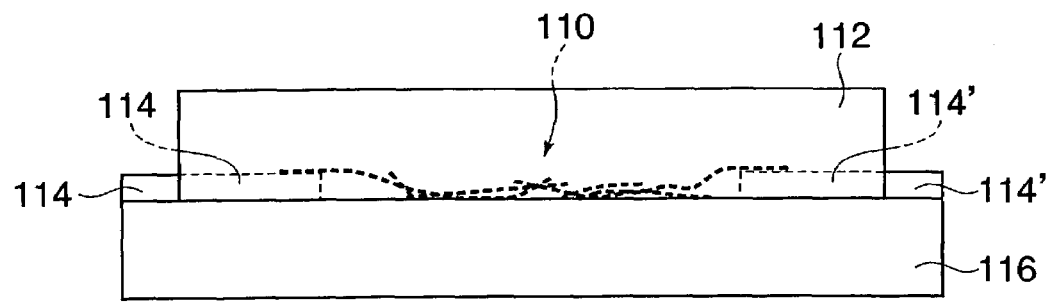
FIG. 15 is a front view showing a state shown in FIG. 14.

FIG. 14 is a plan view showing a state in which the base member layer is formed on the substrate surface through the molding process. Also, FIG. 15 is a front view viewed from a direction indicated by an arrow E in FIG. 14. As shown FIGS. 14 and 15, in this example, the base member layer 112 is formed on the entire substrate 116 except for both ends of the substrate 116 by a given width. In those drawings, parts of the carbon nanotube group 110 and the electrodes 114 and 114' which are hidden by the formation of the base member layer 112 are represented by dotted lines (the same is applied in FIGS. 16 to 18).

The base member layer 112 is so formed as to cover the whole carbon nanotube group 110 as shown in FIGS. 14 and 15. If it is ensured that the electrodes 114 and 114' are only made conductive to the external, those electrodes 114 and 114' may be completely covered or partially covered as in this embodiment.

The base member layer 112 is so formed as to seal the whole carbon nanotube group 110. In the present specification, sealing means that the peripheries of the individual carbon nanotubes are surrounded by the base member layer, and the carbon nanotubes are fixed, that is, the base member layer becomes in a matrix shape including the carbon nanotubes in a dispersion state. Therefore, in the case where the density of the carbon nanotubes in the carbon nanotube group becomes too large into a lump as described above, it is difficult to insert the base member layer into spaces between the respective carbon nanotubes, and gaps are liable to occur. In the case where a large amount of gaps occur, it is no longer a sealing state. This depends on the degree of gap occurrences, and a case in which air bubbles are partially between the carbon nanotubes can be regarded as the sealing state without any problems.

The nonconductive base member layer is made of the above-mentioned material, and the molding method depends on the king of material to be used. When a resin material is used as the material of the base member layer, there can be applied a known molding method, for example, an injection molding method, a coating method in which the resin material is resolved with an appropriate solvent and then coated and hardened, or the like. The kind of molding method to be applied may be appropriately selected in accordance with desired shape and size of the base member layer or the like in addition to the material to be used. Also, in the case of using the resin material, it is necessary to harden the resin material after the resin material has been formed into a given shape, but this molding method may be also appropriately selected in accordance with the material to be used. For example, if a thermoplastic material is used as the material of the base member layer, the material is maintained in a room temperature after the material is resolved in a heating state or with a solvent, or heated to the degree that the solvent is volatilized as occasion demands, so as to be hardened. If a thermosetting material is used as the material of the base member layer, the material is hardened by baking after the material has been formed into a given shape. Also, if an ultraviolet setting material is used, ultraviolet rays maybe irradiated on to the material. In the case where a material that is hardened at a room temperature such as a room-temperature setting an epoxyresin is used, the material may be left as it is. In the case where formation and setting are conducted at the same time as with sputtering, a setting process is not particularly required.

(Cutting Process)

In the method of manufacturing the electric part according to the present invention, the cutting process is directed to a process of cutting at least one carbon nanotube contained in the carbon nanotube group together with the nonconductive base member to obtain a cut surface. In this example, the carbon nanotube group that has been sealed with the substrate and the base member layer is cut in a region where the electrode layer is not formed together with the substrate and the base member layer to obtain the cut surface.

In this example, cutting in the cutting process is so cut as to divide the overall substrate 116 into two equal pieces with a center line F as a boundary in a longitudinal direction thereof. With this cutting, in the carbon nanotube group 110 contained in the nonconductive base member which is made up of the base member layer 112 and the substrate 116, the carbon nanotubes that constitute the carbon nanotube group 110 are cut halfway, and the end portions of the cut surfaces of the cut carbon nanotubes are exposed on the cut surface.

A material to be used for cutting is not particularly limited, but it is desirable to apply a tool which is high in precision and cutting performance. For example, when a general knife is used for cutting, the carbon nanotubes hardly become in states shown in FIGS. 5A to 5C, that is, the carbon nanotubes are difficult to come to a state in which substantially only the end portion is exposed from the surface, and in general, the carbon nanotubes are projected and erect in a state where the carbon nanotubes are napped in fibers.

However, because it is difficult from the working viewpoints that the whole carbon nanotube group are cut into two equal pieces with precision to expose substantially only the end portions of the carbon nanotubes, it is preferable that precise cutting is not particularly conducted at that time, but after the whole carbon nanotube group is divided into two equal pieces, the cut surface is shaved or ground with precision. The term "cut" in the present specification contains the concepts of "shave" and "grind".

The shaving or grinding may be conducted through a method of grinding the surface by polishing or a lathe, but it is preferable to apply a method of sequentially cutting the surface in a slice shape with a precise cutter. A risk that the carbon nanotube is pulled out or torn is prevented by cutting the carbon nanotube in the slice shape, thereby being capable of coming to a state in which substantially only the end portion is exposed.

As a device of cutting the carbon nanotube in the slice shape with high precision, there can be applied, for example, a microtome used to process a sample for a microscope, or the like. When such a high-precision slicing device is used, substantially only the end portion of the carbon nanotube is machined to the degree that the end portion is exposed from the nonconductive base member by cutting the carbon nanotube with the slice interval of, for example, about 100 nm.

A tool which is high in precision and cutting performance may be, for example, a diamond knife or a sapphire knife. That is, it is preferable in the cutting process that the microtome is equipped with the diamond knife or the sapphire knife for shaving.

In the case of using a device that enables slicing at more minute intervals, it is possible to control the length of the exposed portion (exposed amount) of the carbon nanotube more surely. The cut interval at which the carbon nanotube is sliced is preferably as small as possible because the precision becomes high. This is because it is presumed that the exposed amount of the end portion of the carbon nanotube is shorter than the cut interval, and if the exposed amount is made smaller, it more perfectly approaches a state in which only the end portion is exposed. For example, if the cut interval is set to 10 nm, the length of the exposed end portion of the carbon nanotube becomes a value smaller than 10 nm logically, and it is presumed that the actual length is about 2 to 3 nm even at the maximum, to thereby sufficiently come to the state in which substantially only the end portion is exposed.

Figure 17:
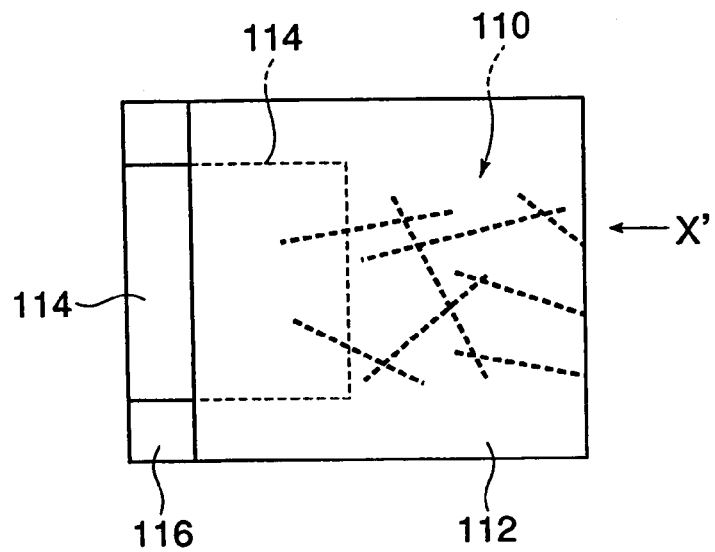
FIG. 17 is a plan view showing a state in which the cutting process has been conducted in a method of manufacturing an electric part in accordance with one example of the present invention.

The electric part according to the first embodiment is manufactured as described above. FIG. 17 is a plan view showing the electric part which is finally obtained after being subjected to cutting in the cutting process according to this example. In this example, in the surface X', the state in which substantially only the end portion of the carbon nanotube is exposed is obtained.

According to the method of manufacturing the electric part in this example as described above, the carbon nanotube group can be readily arranged at a desired position in the arranging process during the sealing process, the state in which substantially only the end portion is exposed can be readily obtained in the cutting state, and the electric part according to the present invention can be manufactured with high productivity and mass production.

This example was described with reference to the mode in which as shown in FIGS. 11 to 16, the slightly slender substrate 116 is used, the two electrodes 114 and 114' are disposed on the surface of the substrate 116, the carbon nanotubes are arranged, and the carbon nanotubes are cut into two pieces along a center line thereof, thereby being capable of manufacturing two electric parts at the same time. However, the present invention is not limited to this mode, but it is needless to say that a structure may be made in which one electrode is formed on the substrate surface, the carbon nanotubes are arranged on the substrate surface, and the substrate is cut at a portion where the carbon nanotubes exist. However, this example in which two electric parts are manufactured at the same time is advantageous in that the productivity is high. Also, this example is advantageous in that whether the carbon nanotubes among the carbon nanotube group 110 are mutually electrically connected to each other, and parts of the carbon nanotubes are electrically in contact with the electrodes 114 and 114', or not, can be recognized by measuring the conductive state between the electrode 114 and the electrode 114', after the arranging process and the molding process. The conductive state is recognized, and if an insulating state is found, it is rational to newly remanufacture the electric part without conducting the subsequent processes.

<Second Electrode Layer Forming Process>

In the method of manufacturing the electric part according to the present invention, the second electrode layer forming process is directed to a process, which is conducted subsequent to the cutting process, of forming the second electrode layer on the cut surface. As described above, the electric part according to the second embodiment is manufactured by conducting the second electrode layer forming process.

Figure 18:
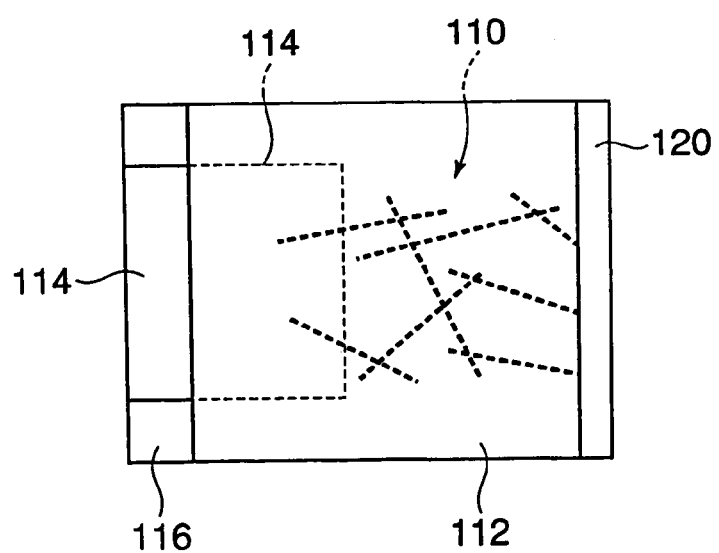
FIG. 18 is a plan view showing a state in which a second electrode layer forming process has been conducted in a method of manufacturing an electric part in accordance with one example of the present invention.

FIG. 18 is a plan view showing a state in which the second electrode layer is formed through the second electrode layer forming process. As shown in FIG. 18, a second electrode layer 120 is formed on the cut surface (the surface X' in FIG. 17) which has been cut in the cutting process.

The second electrode layer 120 can be formed by depositing a metal such as gold or platinum as with the electrode 114 which is the first electrode. The forming method of the second electrode layer 120 is not particularly limited in any materials, and various conventionally known methods are appropriately selected, thereby being capable of forming the second electrode 120 having the desired shape and thickness. However, since there is provided a condition that the second electrode layer is so formed as to be electrically connected to substantially only exposed end portions of the carbon nanotubes among the carbon nanotube Group 110, attention must be paid to the condition. A normal vapor deposition method, a coating method using a conductive organic high polymer, a hot dipping method in which a metal material or the like is melted and immersed, and other plating methods are preferable because the second electrode layer that satisfies the above-mentioned condition can be readily formed.

SECOND MANUFACTURING EXAMPLE

In a second manufacturing example, an example will be described in which the sealing process is not a process consisting of the arranging process and the molding process, but the carbon nanotube group is sealed at a time through injection molding.

(Sealing Process)

A first outgoing tube and a second outgoing tube that forms an outgoing port in the periphery of the first outgoing tube concentric-circularly are arranged. When melted resin materials are injected from the respective outgoing tubes at the same time, a molding product in which the resin material injected from the first outgoing tube is surrounded by the resin material injected from the second outgoing tube is obtained.

The first outgoing tube mainly outputs a dispersion material in which the carbon nanotubes are dispersed in the insulating resin with a concentration of the degree at which the carbon nanotubes are electrically connected to each other. Also, the second outgoing tube outputs the insulating resin. The insulating resins outputted from both of those outgoing tubes are materials of the nonconductive base described above and may be identical with or different from each other.

The dispersion material outputted from the first outgoing tube in which the carbon nanotubes are dispersed in the insulating resin and the insulating resin outputted from the second outgoing tube which surrounds the dispersion material are outputted at the same time, and thereafter hardened. The hardening method is described above. As a result, a material in which the carbon nanotube group is positioned in the center thereof is formed.

<Cutting Process and Electrode Forming Process>

Subsequently, when the material is cut at two portions by a low-precision cutting tool such as a glass cutter, not only the end surface but also the side surface of the carbon nanotube is exposed from the insulating resin because the cutting precision is coarse. An electric conductive material such as metal is selected and deposited on both ends of the cut material to form a first electrode layer. In this situation, the conduction state of both the ends is confirmed, and the material whose electric conduction is confirmed becomes a state in which the first electrode and the side surface of at least one carbon nanotube contained in the carbon nanotube group are connected to each other. As the method of forming the first electrode layer, the same method as the formation of the second electrode layer in the first manufacturing example can be applied (electrode forming process).

In addition, an appropriate portion between the first electrodes that are formed on both ends of the carbon nanotube is cut by the method described with reference to the cutting process in the first manufacturing example, for example, the diamond knife. As a result, substantially only the end surface can be exposed (cutting process). Thus, the electric part having the minute electrode can be obtained. The preferred mode of cutting in the cutting process is also identical with that in the first manufacturing example, and therefore its description will be omitted.

The electric part according to the first embodiment is manufactured as described above. Similarly, in this example, the same electric part as that shown in FIG. 17 is manufactured as in the first manufacturing example.

According to the method of manufacturing the electric part in this example as described above, the carbon nanotube group can be arranged at a desired position in the sealing process at a time, the first electrode and the side surface of at least one carbon nanotube contained in the carbon nanotube group can be also readily connected to each other in the electrode forming process, and the state in which substantially only the end portion is exposed can be further readily obtained in the cutting process, thereby being capable of manufacturing the electric part of the present invention with high productivity and mass production.

Other detailed structures are identical with those in the first manufacturing example. Also, the electric part according to the second embodiment is manufactured by conducting the second electrode layer forming process as occasion demands as in the first manufacturing example, and its detailed description will be omitted.

THIRD MANUFACTURING EXAMPLE

In a third example, there will be described an example in which the first electrode is made of a metal material that can form a nonconductive oxide layer through oxidation, and a portion that is cut in the cutting process is in a region where the electrode is formed.

In the above first manufacturing example, a noble metal such as Au is used as the material of the first electrode, but in this example, the material of the first electrode is changed to Al which is a metal material that can form the nonconductive oxide layer through oxidation. Then, the processes up to the sealing process are conducted as in the first manufacturing example. However, as shown in FIG. 19, a substrate 116" as used is shorter than the substrate 116 of the first manufacturing example in the longitudinal direction, and an electrode 114" is continuously formed without any discontinuation in the form of a band at both ends of the substrate 116" in the longitudinal direction during the electrode layer forming process.

Figure 19:
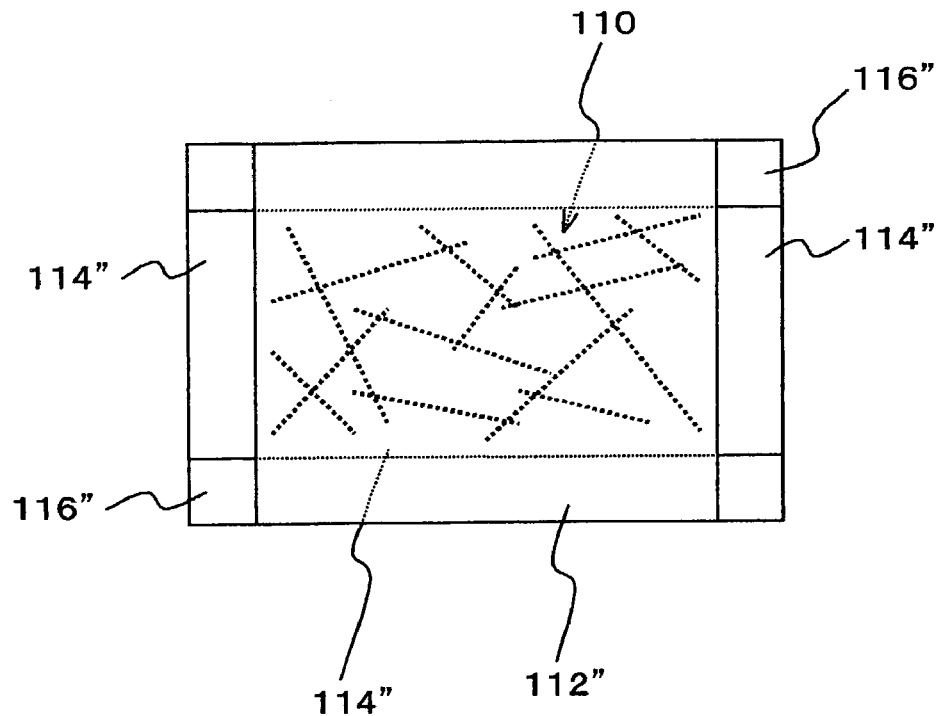
FIG. 19 is a plan view showing a state in which a molding process in a sealing process has been completed, a carbon nanotube group is arranged on a substrate surface, an electrode layer is formed, and a base member layer is formed in a method of manufacturing an electric part in accordance with another example of the present invention.

FIG. 19 is a plan view showing a state in which the molding process during the sealing process in this example is completed, the carbon nanotube group is arranged on the substrate surface, the electrode layer is formed, and the base member layer is formed. In the figure, parts of the carbon nanotube group 110 and the electrodes 114" which are hidden by the formation of the base member layer 112" are represented by dotted lines (the same is applied in FIG. 21). Other various conditions, preferred materials and so on are identical with those in the first manufacturing example, and therefore their detailed descriptions will be omitted.

Subsequently, the cutting process is conducted. In the cutting process of this example, the carbon nanotube group which is sealed with the substrate and the base member layer is cut in the region where the electrode layer is formed together with the substrate and the base member layer, to obtain the cut surface.

Figure 20:
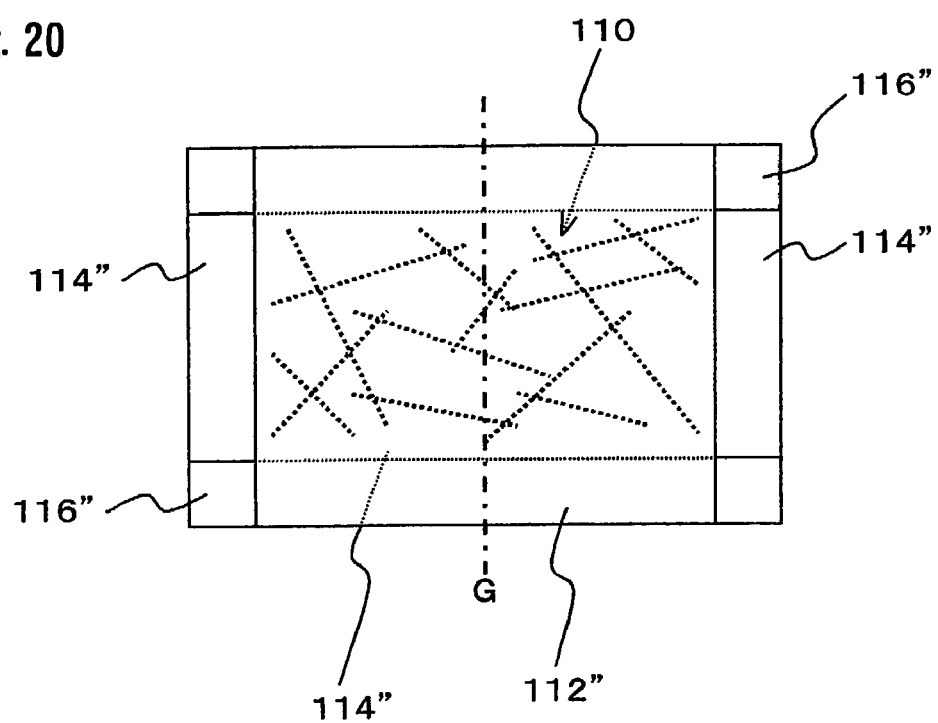
FIG. 20 is a plan view showing a cut portion in a cutting process in a method of manufacturing an electric part in accordance with another example of the present invention.

In this example, the cutting in the cutting process is so conducted as to divide the entire substrate 116 into two equal pieces with the center line G in the longitudinal direction as a boundary as shown in FIG. 20. Through the cutting, in the carbon nanotube group 110 contained in the nonconductive base member which is made up of the base member layer 112" and the substrate 116", the carbon nanotubes that constitute the carbon nanotube group 110 are cut halfway, and in the cut surface, the end portion of the carbon nanotube which is the cut surface of the cut carbon nanotube is exposed. The cutting manner and so on are identical with those in the first manufacturing example, and therefore their detailed descriptions will be omitted.

In this example, the electrode 114" as well as the base member layer 112", the substrate 116", and the carbon nanotube group 110 is also cut by cutting in the cutting process. In this case, the end portion of the electrode 114" is exposed from one surface of the nonconductive base member which is made up of the base member layer 112" and the substrate 116" together with the end portion of the carbon nanotube. However, because Al used as the material of the electrode 114" is a metal material that can readily form the oxide layer by coming in contact with the atmospheric air, the exposed end portion is oxidized into an insulating state.

Figure 21:
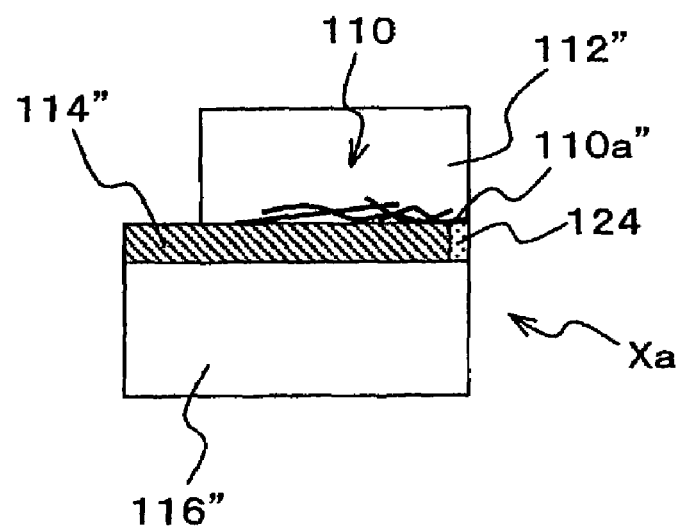
FIG. 21 is a cross-sectional view showing an electric part finally obtained in a method of manufacturing an electric part in accordance with another example of the present invention.

FIG. 21 is a cross-sectional view showing the electric part of this example which is finally obtained by cutting in the cutting process of this example. The sectional view is so drawn as to make many portions of the carbon nanotubes of the carbon nanotube group 110 visible for facilitation of explanation, but a part of the carbon nanotubes is in fact hidden by the remaining base member layer 112".

As shown in FIG. 21, in a cut surface Xa, a nonconductive oxide layer 124 is formed in the periphery of the exposed end portion of the electrode 114". As a result, in addition to the base member layer 112" and the substrate 116" which are made of the nonconductive base member, the periphery of the end portion of the carbon nanotube 110a" which is exposed from the cut surface Xa is also surrounded by the insulating state. Therefore, in this example, the electric part having the minute electric end portion according to a modified example of the first embodiment can be formed.

In the case where the carbon nanotube per se in the carbon nanotube group 110 to be cut is electrically connected with the electrode 114" at a side surface thereof as in this example, because the connection portion and the end portion of the carbon nanotube which is exposed from the cut surface Xa approach each other, a loss (resistor) at the connection point between the carbon nanotubes does not occur as compared with a case of the carbon nanotube group which is rendered conductive by electrically connecting plural carbon nanotubes to each other. Also, even in the case where the carbon nanotube which is connected to the electrode 114" at the side surface thereof and the carbon nanotube to be cut are different from each other, because the exposed end portion approaches a portion which is connected to the first electrode at the side surface thereof closer than the case of the first manufacturing example in which cutting is made in the region where the electrode is not formed, the loss can be reduced.

In this example, because Al that can readily form the oxide layer by coming in contact with the atmospheric air is used as the material of the electrode 114", the electrode 114" is oxidized to form the oxide layer 124 nearly at the same time when cutting is made in the cutting process. However, in the case where a metal material that does not allow the formation of the oxide layer having a sufficient thickness by only coming in contact with the atmospheric air is used as the electrode material, the exposed end portion of the electrode is subjected to a known oxidizing processing to form an oxide layer later. Also, even in the case where the metal material that can readily form the oxide layer by coming in contact with the atmospheric air is used as the electrode material, when sufficient insulation is intended to be ensured by forming the thicker oxide layer, the exposed end portion of the electrode may be subjected to the known oxidizing processing to form the oxide layer later likewise. As the applicable known oxidizing processing, in the case where, for example, Al is used as the electrode material, an anodic oxidizing processing is applied.

Other detailed structures are identical with those in the first manufacturing example. Also, the electric part of the second embodiment is manufactured by conducting the second electrode layer forming process as occasion demands as in the first manufacturing example, and its detailed description will be omitted.

The electric part and the method of manufacturing the electric part according to the present invention are described above with reference to the preferred embodiments and manufacturing examples. However, the present invention is not limited to those examples, but any known structures can be diverted and/or added so far as the structure of the present invention is provided.

EXAMPLES

Hereinafter, the present invention will be described in more detail with reference to the examples.

Example 1

An electric part useable as a sensor electrode in accordance with Example 1 is manufactured through the processes shown in FIGS. 11 to 17. The details will be described below.

Au is formed on a surface of a polyimide film that acts as the substrate 116 (20 mm×5 mm×20 μm, and 1×10$^{12}$ Ωcm in volume resistance) in a given region from both the ends through the vapor deposition method, to thereby obtain a state shown in FIG. 11 where the electrodes 114 and 114' (7 mm×1 mm×about 200 nm, respectively) are formed (electrode layer forming process).

On the other hand, multi-layer carbon nanotubes that are 20 nm in number average diameter and 3 μm in number average length are added in a dispersion medium with a concentration of 0.1 mass % to prepare a dispersion solution A. The dispersion medium in which a surface active agent (benzalkonium chloride made by Wako Pure Chemical Industries, Ltd.) is added to water with 1 mass % is used.

A droplet o the thus obtained dispersion solution A drops down on the substrate 116 surface between the electrode 114 and the electrode 114' and in the periphery thereof with the amount of 1 μl, and is then developed in the region 122 shown in FIG. 12. Thereafter, the dispersion solution A is dried at a temperature of 70° C. for one minute, and the carbon nanotube group 110 is so arranged as to come to a state in which the carbon nanotubes bridge a portion between the electrode 114 and the electrode 114' as shown in FIG. 13 (arranging process during the sealing process).

Subsequently, as shown in FIGS. 14 and 15, the entire surface is sealed with an epoxy resin (araldite made by Chiba Geigy Co., 10$^{13}$ Ωcm or more in volume resistance) which serves as the base member layer 112 such that the overall carbon nanotube group 110 and a part of the electrodes 114 and 114' (the overall region except for about 5 mm from both end portions of the substrate 116) are covered with the epoxy resin. Thereafter, the epoxy resin is left at a room temperature for about 12 hours and hardened, to thereby form the base member layer 112 (the thickness of 2 mm from the substrate 116) (molding process during the sealing process). At this stage, as a result of checking the conduction state between the electrode 114 and the electrode 114', it is confirmed that a current flows.

Figure 16:
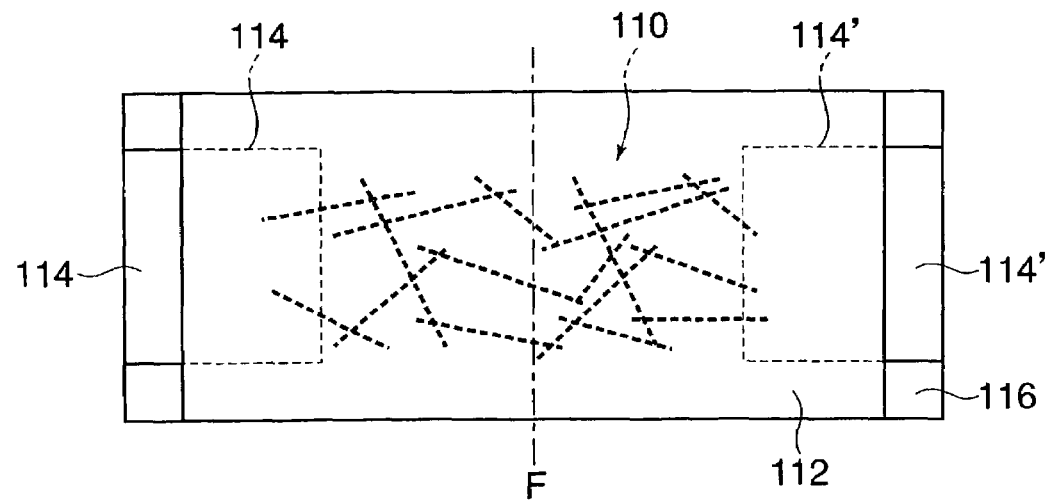
FIG. 16 is a plan view showing a cut portion in a cutting process in a method of manufacturing an electric part in accordance with one example of the present invention.

In FIG. 16, the substrate 116 is cut into two pieces by using a cutter at a position indicated by a center line F, that is, along a center line of the substrate 116 in the longitudinal direction. Then, the cut surface of one of those two cut products is mechanically sliced by using a diamond knife by 20 times (intervals of 100 nm). The cutting operation is conducted by using a microtome for microscope sample processing (the above process is the cutting process). The electric part structured as shown in FIG. 17 according to Example 1 is manufactured as described above.

The measurement of voltammetry is conducted on the electric part obtained by this example. The voltammetry is directed to a method in which an electrolytic cell is used, the potential of a reference electrode such as a hydrogen electrode or an Ag/AgCl electrode is set as a reference potential, and a relationship between a voltage applied between a counter electrode and a working electrode or the potential of the working electrode and a current that flows between the counter electrode and the working electrode is investigated. In this example, an electrochemical analyzer 600A made by BAS Co. is used, and an Ag/AgCl electrode as the reference electrode and a Pt electrode as the counter electrode are applied. A voltage is scanned at an appropriate voltage scanning rate (0.05 to 1 V/s), and a current value is read in a personal computer by an A/D converter to obtain a current-to-voltage characteristic data. The electrolyte solution used is NaCl aqueous solution (0.1 N).

Figure 22:
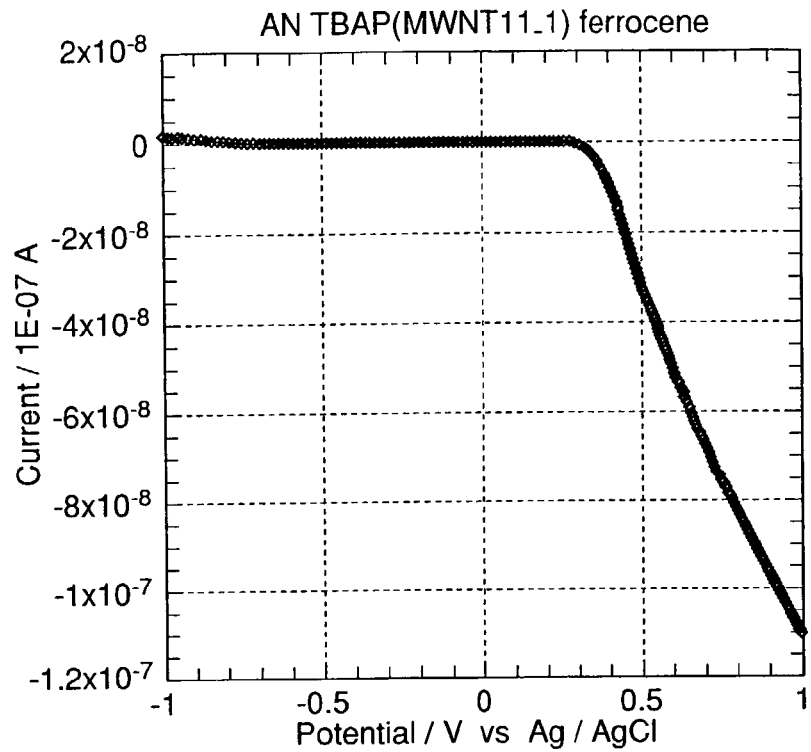
FIG. 22 is a graph exhibiting a measured result of a voltammetry in an electric part in accordance with Example 1.

A graph exhibiting the measured result is shown in FIG. 22. As shown in FIG. 22, it is found that the electric part according to this example functions as a sensor electrode that enables a high-speed response without drawing a hysteresis curve.

Comparative Example 1

An Au electrode is prepared as an electrode of a comparative example, and is set as an electric part of Comparative Example 1. The Au electrode of this comparative example is specifically directed to an electrode in which an Au wire which is 1.6 mm in diameter (purity of 99.9%) is coated with an urethane resin, and only the end portion of the Au wire is exposed.

Figure 23:
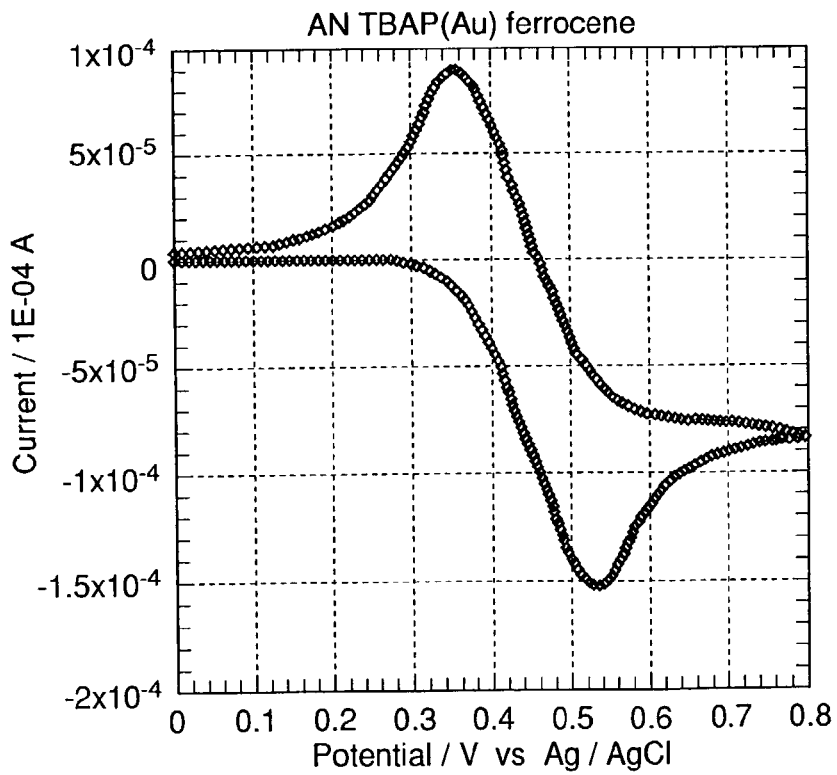
FIG. 23 is a graph exhibiting a measured result of a voltammetry in an electric part in accordance with Comparative Example 1.

The measurement of voltammetry is conducted on the electric part obtained by this comparative example as in Example 1. A graph exhibiting the measured result is shown in FIG. 23. As shown in FIG. 23, it is found that the electric part of this comparative example is not preferable as the high-speed response sensor electrode as in the conventional sensor electrode because it draws the hysteresis curve.

Example 2

An electric part according to Example 2 is manufactured as in Example 1 except that the carbon nanotubes used in Example 1 is replaced by single-layer carbon nanotubes which are about 1 nm in number average diameter and 3 mm in number average length.

Figure 24:
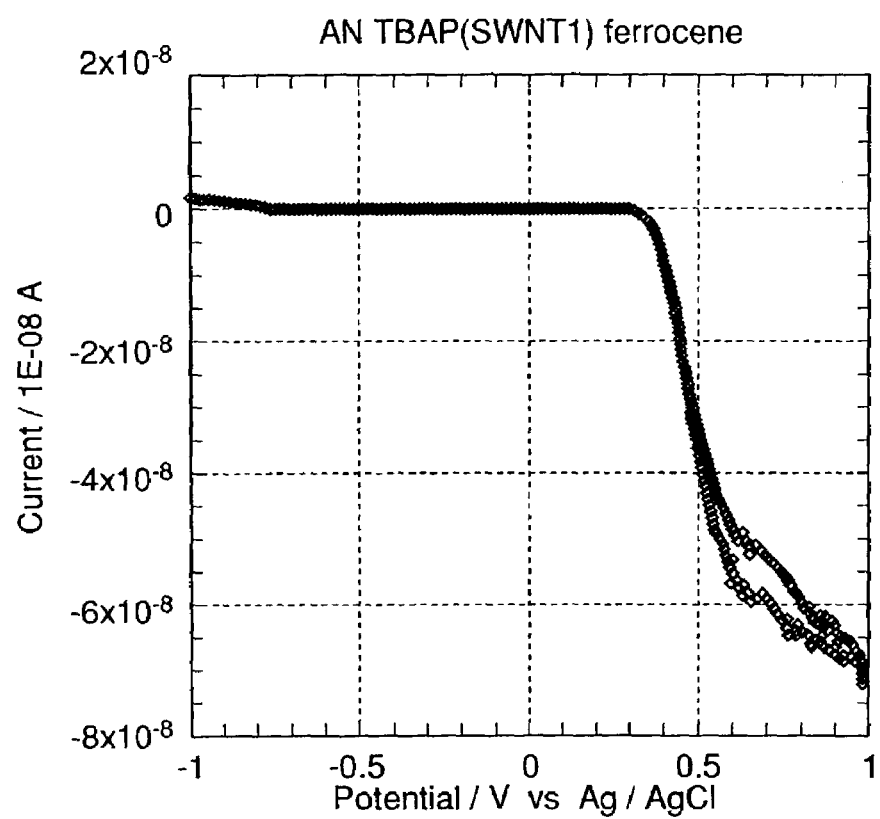
FIG. 24 is a graph exhibiting a measured result of a voltammetry in an electric part in accordance with Example 2.

The measurement of voltammetry is conducted on the electric part obtained by this example as in Example 1. A graph exhibiting the measured result is shown in FIG. 24. As shown in FIG. 24, it is found that the electric part according to this example functions as a sensor electrode that enables a high-speed response without drawing a hysteresis curve.

Example 3

The electric part manufactured in Example 1 (using the multi-layer carbon nanotubes) is further subjected to a second electrode layer forming process shown in FIG. 18, to thereby manufacture the electric part of Example 1 which is useable as a rectifier. The details will be described below. In the electric part manufactured in Example 1 having the structure shown in FIG. 17, Au is formed on a surface X" through the vapor deposition method (second electrode layer forming process) to manufacture an electric part according to Example 3 having the structure shown in FIG. 18 in which a second electrode layer 120 is formed in thickness of about 200 nm.

Figure 25:
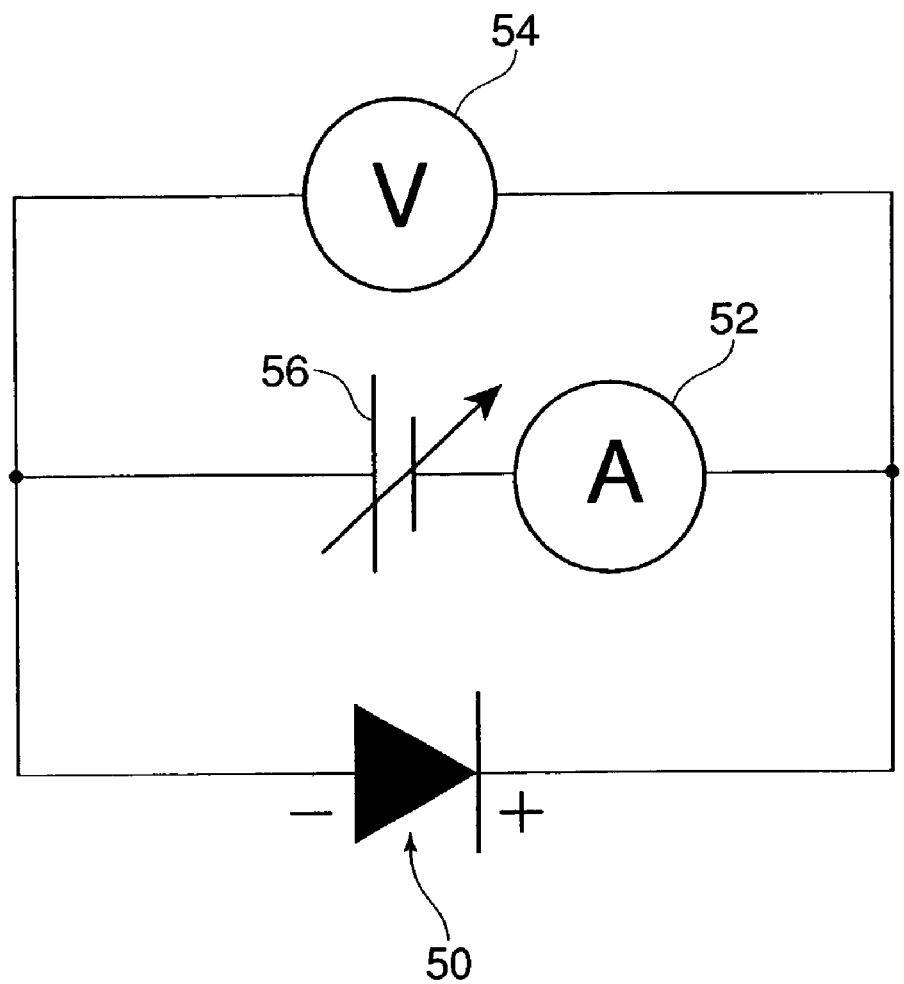
FIG. 25 is a circuit diagram showing a device used for measurement of a current-to-voltage characteristic in accordance with examples.

The measurement of the current-to-voltage characteristic is conducted on the electric part obtained in accordance with this example. The measurement of the current-to-voltage characteristic is made in a state where the electric part of this example is assembled in the device shown in a circuit diagram of FIG. 25. Referring to FIG. 25, reference numeral 50 denotes an electric part according to this example, reference numeral 52 denotes an ammeter, reference numeral 54 is a voltmeter, and reference numeral 56 denotes a power supply device, respectively. The circuit is assembled such that the positive pole and the negative pole of the electric part 50 according to this example are directed as shown in the figure. Then, an applying voltage is made to fluctuate by the power supply device 56 to measure the values of the voltmeter 54 and the ammeter 52.

Figure 26:
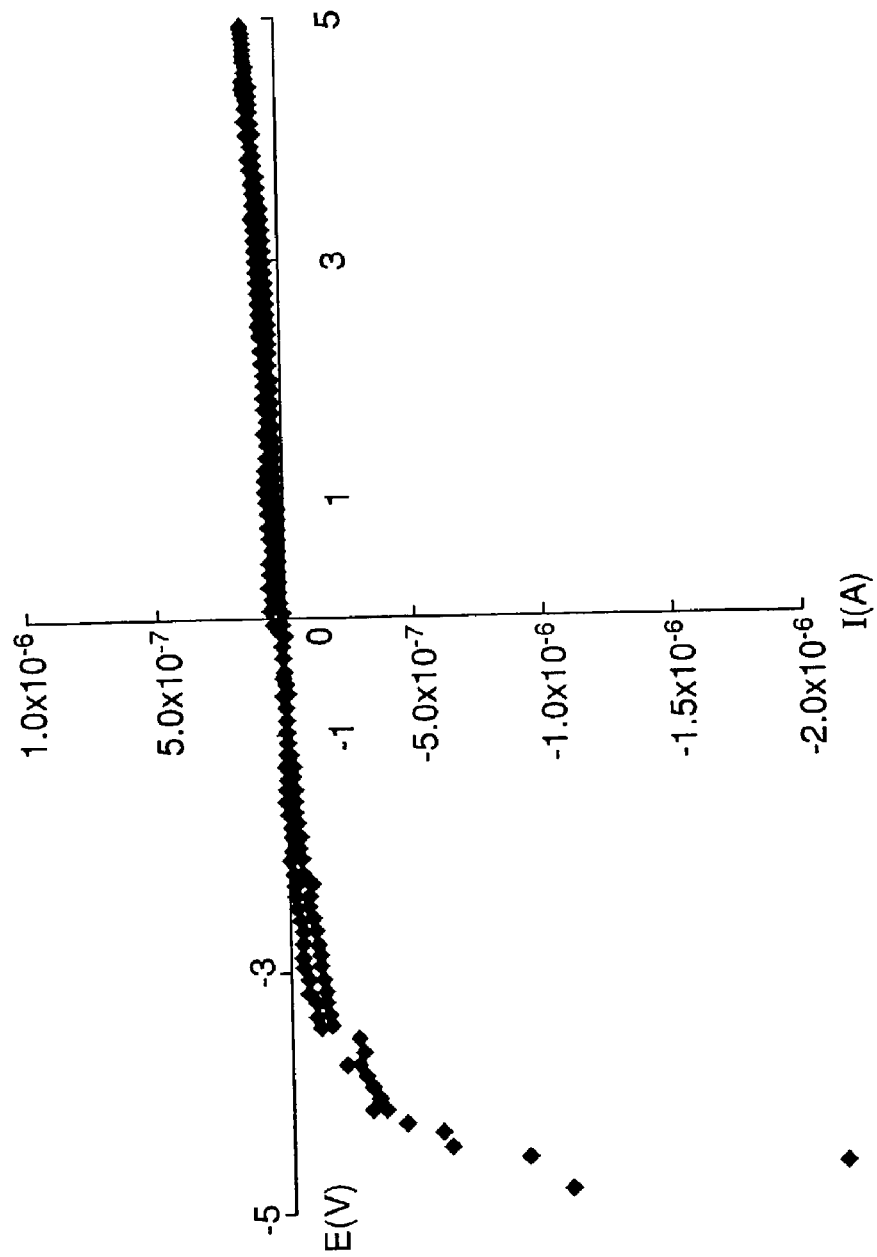
FIG. 26 is a graph exhibiting a measured result of a current-to-voltage characteristic in an electric part in accordance with Example 3.

A graph exhibiting the results of the current-to-voltage characteristic is shown in FIG. 26. In the graph shown in FIG. 26, the values of the voltmeter 54 are plotted on the axis of abscissa and the values of the ammeter 52 are plotted on the axis of ordinate, respectively (the same is applied to FIGS. 27 to 31). As shown in FIG. 26, it is recognized that the electric part according to this example functions as a rectifier and found that the electric part is useable as the rectifier.

Example 4

An electric part according to Example 4 is manufactured in the same manner as that of Example 3 except that an object to be subjected to the second electrode layer forming process is replaced by the electric part (using the single-layer carbon nanotube) which is manufactured in accordance with Example 2.

Figure 27:
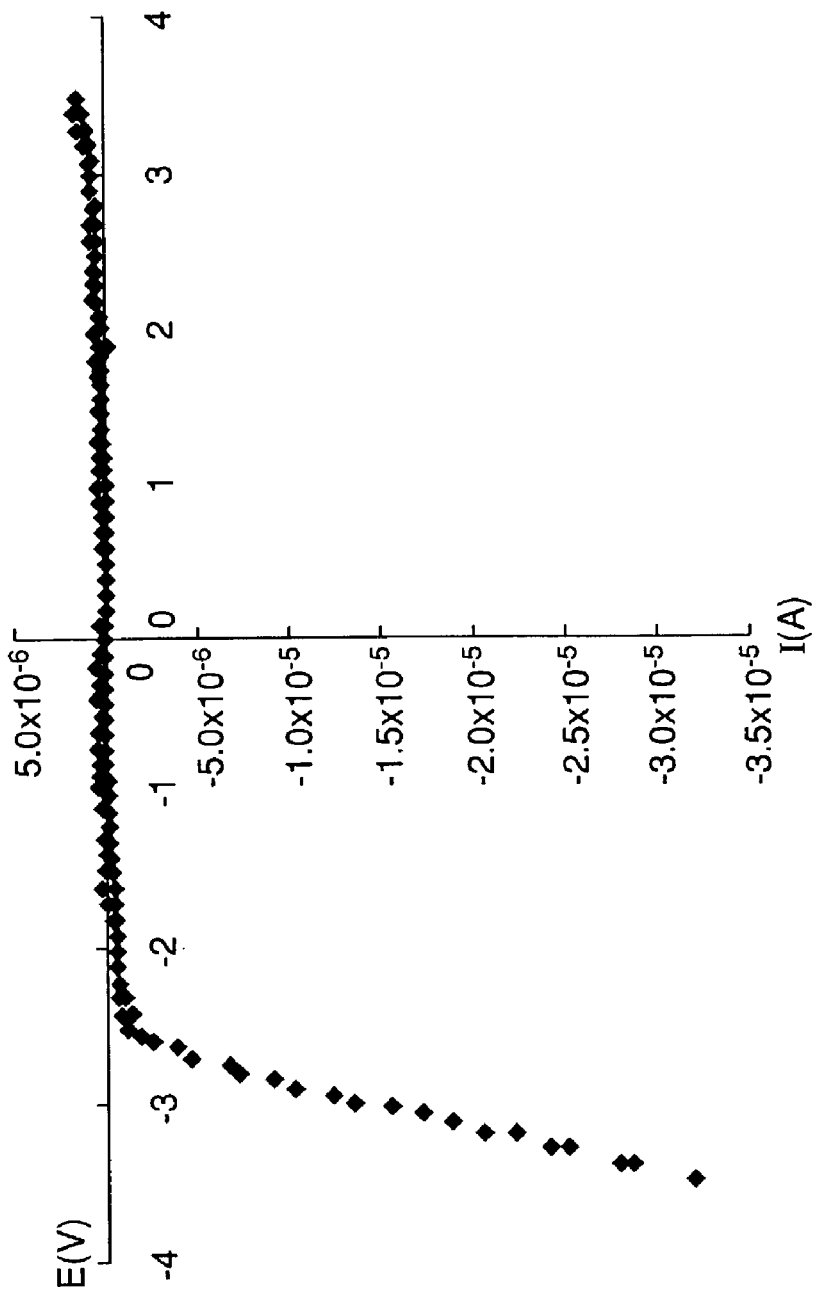
FIG. 27 is a graph exhibiting a measured result of a current-to-voltage characteristic in an electric part in accordance with Example 4.

The measurement of the current-to-voltage characteristic is conducted on the electric part of this example in the same manner as that of Example 3. A graph exhibiting the measured results is shown in FIG. 27. As shown in FIG. 27, it is recognized that the electric part according to this example functions as a rectifier and found that the electric part is useable as the rectifier.

Example 5

The electric part useable as the rectifier according to Example 1 is manufactured through the processes shown in FIGS. 11 to 18. However, in this example, the arranging process during the sealing process is conducted prior to the electrode layer forming process. Therefore, strictly speaking, the vertical positional relationship between the carbon nanotube and the electrode and the processing order are different from those in the processes shown in FIGS. 11 to 18. The details will be described below.

The multi-layer carbon nanotubes that are 20 nm in number average diameter and 3 μm in number average length are added in a dispersion medium with a concentration of 0.1 mass % to prepare a dispersion solution B. The dispersion medium in which a surface active agent (benzalkonium chloride made by Wako Pure Chemical Industries, Ltd.) is added to water with 1 mass % is used.

Supposing positions at which the electrodes 114 and 114' shown in FIGS. 11 and 12 are going to be formed, a droplet of the obtained dispersion solution B drops down on the surface of a polyimide film (20 mm×5 mm×20 μm, and $10^{13}$ Ωcm or more in volume resistance) which serves as the substrate 116 between the electrode 114 and the electrode 114' to be formed and in the periphery thereof with the amount of 1 μl, and is then developed. Thereafter, the dispersion solution B is dried at a temperature of 70° C. for two minutes, and the carbon nanotube group 110 is so arranged as to come to a state in which the carbon nanotubes bridge a portion between the electrode 114 and the electrode 114' to be formed (arranging process during the sealing process).

Au is formed on a given region from both the ends through the vapor deposition method to obtain a state shown in FIG. 13 in which the electrodes 114 and 114' (7 mm×1 mm×about 200 nm, respectively) are formed (electrode layer forming process).

Subsequently, as shown in FIGS. 14 and 15, the entire surface is sealed with an epoxy resin (araldite made by Chiba Geigy Co., $10^{13}$ Ωcm in volume resistance) which serves as the base member layer 112 such that the overall carbon nanotube group 110 and a part of the electrodes 114 and 114' (the overall region except for about 5 mm from both end portions of the substrate 116) are covered with the epoxy resin. Thereafter, the epoxy resin is left at a room temperature for about 12 hours and hardened, to thereby form the base member layer 112 (the thickness of 2 mm from the substrate 116) (molding process during the sealing process). At this stage, as a result of checking the conduction state between the electrode 114 and the electrode 114', it is confirmed that a current flows.

In FIG. 16, the substrate 116 is cut into two pieces by using a cutter at a position indicated by a center line F, that is, along a center line of the substrate 116 in the longitudinal direction. Then, the cut surface of one of those two cut products is mechanically sliced by using a diamond knife by 30 times (intervals of 100 nm) The cutting operation is conducted by using a microtome for microscope sample processing (the above process is the cutting process). The electric part according to Example 5 is manufactured as described above.

Figure 28:
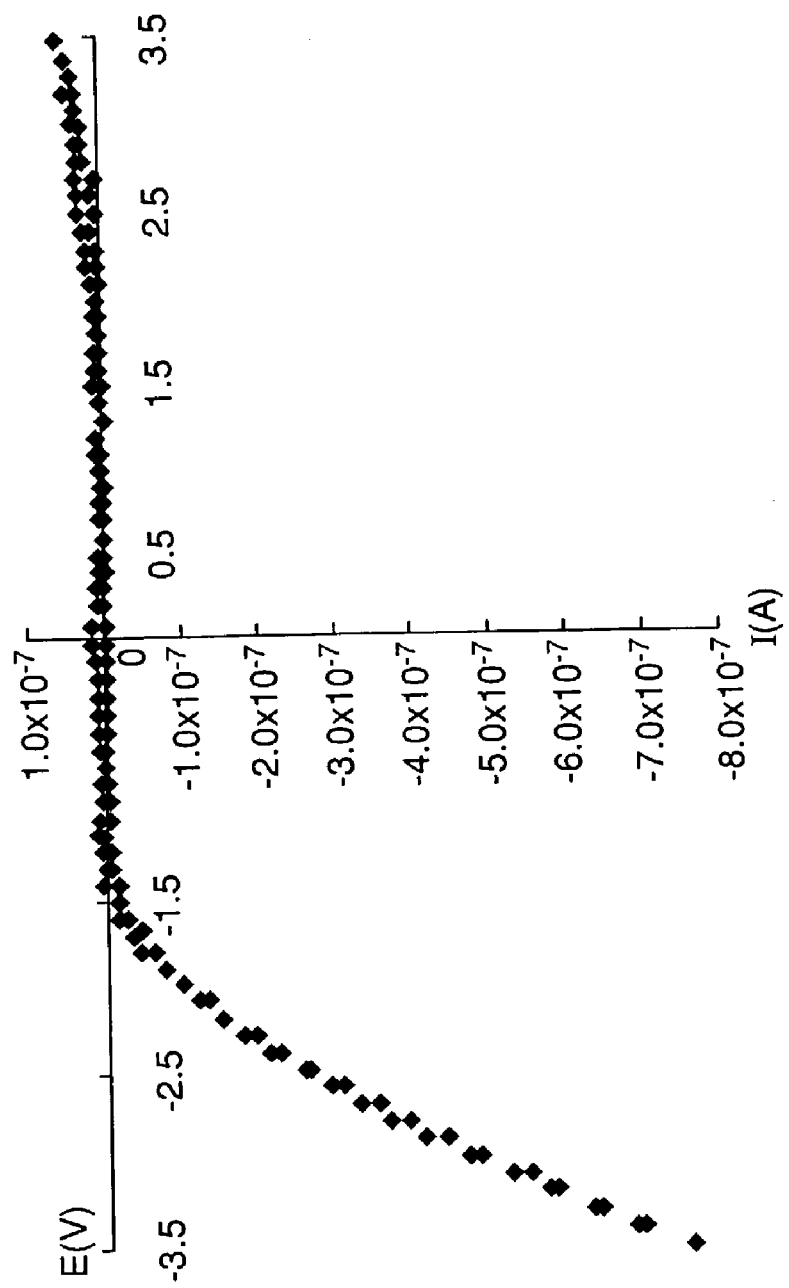
FIG. 28 is a graph exhibiting a measured result of a current-to-voltage characteristic in an electric part in accordance with Example 5.

The measurement of the current-to-voltage characteristic is conducted on the electric part of this example in the same manner as that of Example 3. A graph exhibiting the measured results is shown in FIG. 28. As shown in FIG. 28, it is recognized that the electric part according to this example functions as a rectifier and found that the electric part is useable as the rectifier.

Comparative Example 2

In Example 1, a product that has been subjected to the sealing process but not yet subjected to the cutting process is prepared as an electric part of Comparative Example 2. The electric part is in a state where the carbon nanotubes are connected to both of the electrode 114 and the electrode 114' on a side surface thereof, and those electrodes 114 and 114' serve as respective terminals. In Example 1, it has been already confirmed that a current flows between both the terminals.

Figure 29:
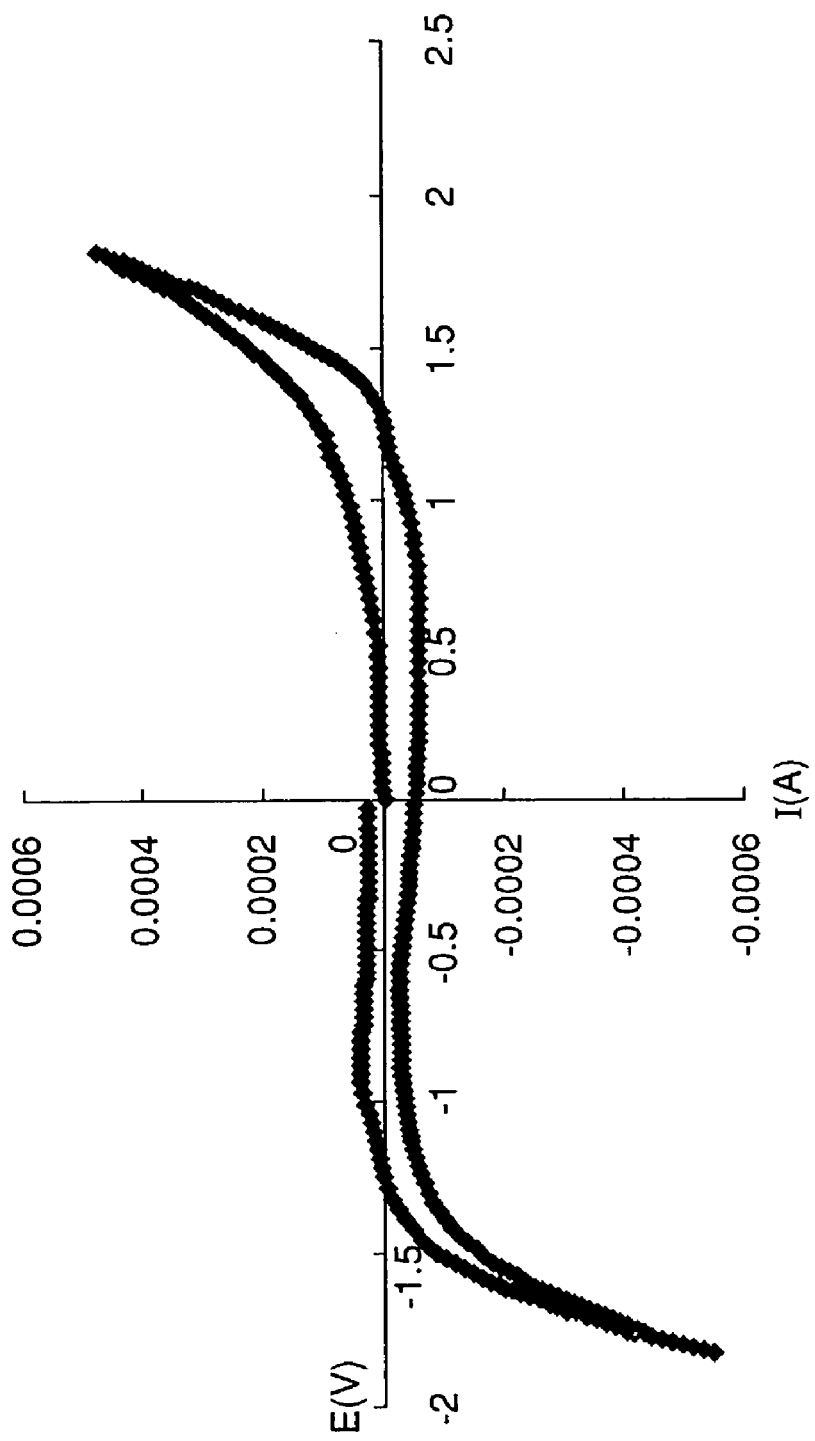
FIG. 29 is a graph exhibiting a measured result of a current-to-voltage characteristic in an electric part in accordance with Comparative Example 2.

The measurement of the current-to-voltage characteristic is conducted on the electric part of this comparative example in the same manner as that of Example 3. A graph exhibiting the measured results is shown in FIG. 29. As shown in FIG. 29, it is recognized that the electric part according to this comparative example does not function as a rectifier at all.

Comparative Example 3

In the case where the electric part manufactured in Example 1 (using the multi-layer carbon nanotube) is further subjected to the second electrode layer forming process shown in FIG. 18, when roughness occurs on the surface of the surface X due to a cutting failure, a contact defect occurs between the second electrode layer and the carbon nanotube end portion when the second electrode layer is deposited. The details will be described below.

In manufacturing the electric part manufactured in Example 1 having the structure shown in FIG. 17, the cutting operation is made by a glass knife instead of the diamond knife during the cutting process, with the result that the roughness occurs on the surface X". The roughness is about 100 to 300 nm in the degree of roughness in the depth wise direction. Au is formed on the rough surface X" through the vapor deposition method, to thereby form the second electrode layer 120 which is about 200 nm in thickness. The structure is identical with that of the electric part having the structure shown in FIG. 18 according to Example 3. The electric part according to Comparative Example 3 is thus manufactured.

Figure 30:
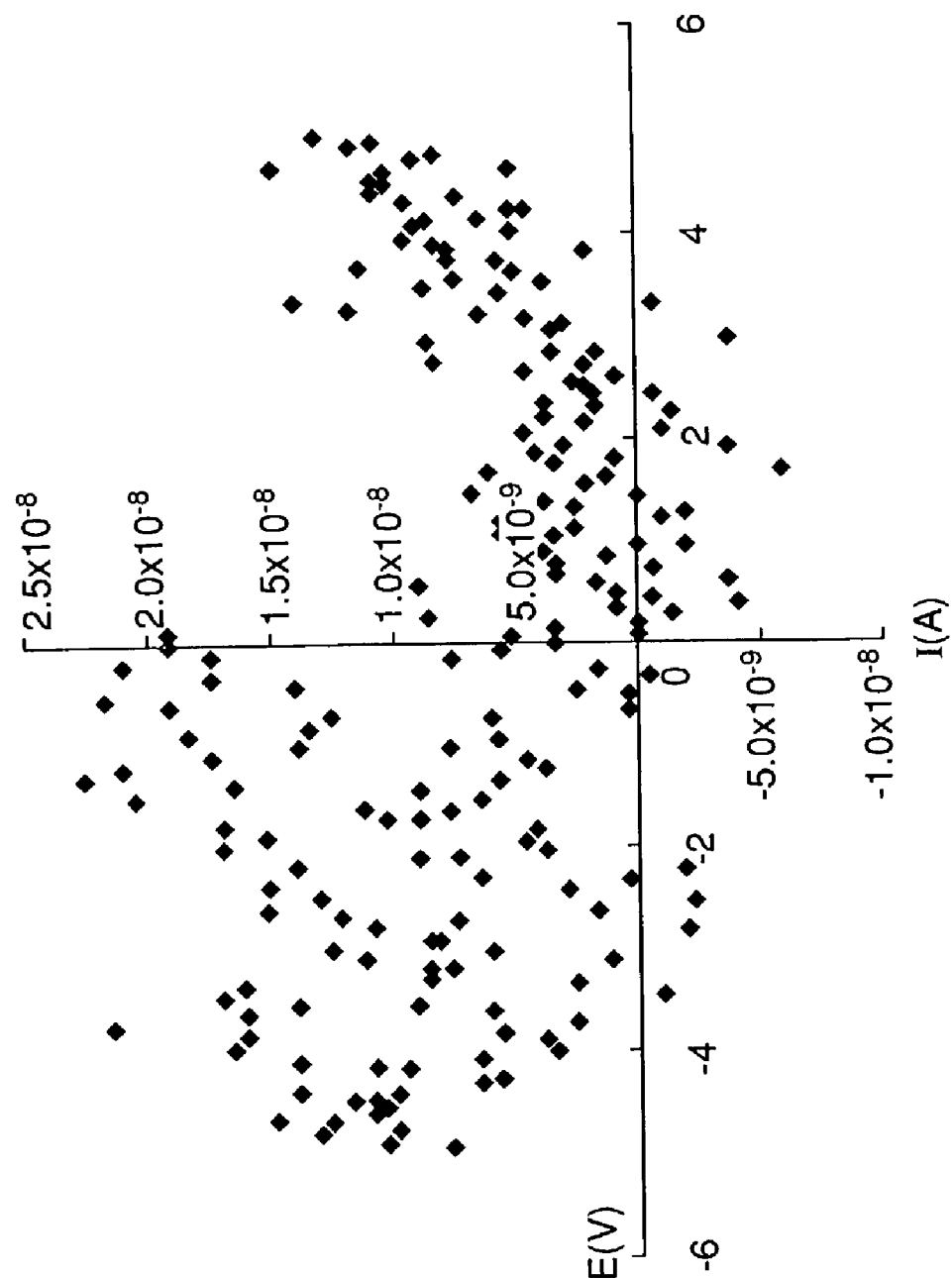
FIG. 30 is a graph exhibiting a measured result of a current-to-voltage characteristic in an electric part in accordance with Comparative Example 3.

The measurement of the current-to-voltage characteristic is conducted on the electric part of this comparative example in the same manner as that of Example 3. A graph exhibiting the measured results is shown in FIG. 30. As shown in FIG. 30, even if the voltage is applied, the measured current value is $3 \times 10^{-8}$ A or less, which is substantially equal to or less than a measurement limit of the ammeter used for measurement. Moreover, it is found that the current-to-voltage characteristic is hardly correlated, and no current flows between the electrodes except for a leak current.

Comparative Example 4

In the method of manufacturing the electric part (using the multi-layer carbon nanotube) shown in Example 1, when the dispersion solution 122 of the carbon nanotube shown in FIG. 12 is coated on the surface of the substrate 112, if the dispersion in the dispersion solution 122 is insufficient, and the dispersion solution 122 is fixed on the surface of the substrate 112 in a state where the carbon nanotube is aggregated after coating, a sufficient rectification characteristic does not appear. The detailed manufacturing method will be described below.

The same processes as those of Example 1 are conducted up to the electrode layer forming process. In the arranging process during the sealing process which is a succeeding process in Example 1, when the dispersion solution A is prepared, the dispersion medium having the carbon nanotube concentration of 1 mass % to which a surface active agent is not added is used to prepare a dispersion solution C in the same manner as the dispersion solution A.

The dispersion solution C thus obtained is dropped down, developed and dried in the same manner as that of Example 1 to arrange the carbon nanotube group 110. In this situation, the agglomerate of the carbon nanotube which is about 100 to 500 μm in diameter is generated.

In this situation, the electric part of Comparative Example 4 is manufactured through the processes subsequent to the sealing process which are identical with those of Example 3. The structure is identical with that of the electric part having the structure shown in FIG. 18 according to Example 3. In the state shown in FIG. 17 where the cutting process has been finished, the agglomerate of the carbon nanotube is exposed on the surface X", and the agglomerate and the second electrode layer 120 are connected directly to each other in the second electrode layer forming process.

Figure 10:
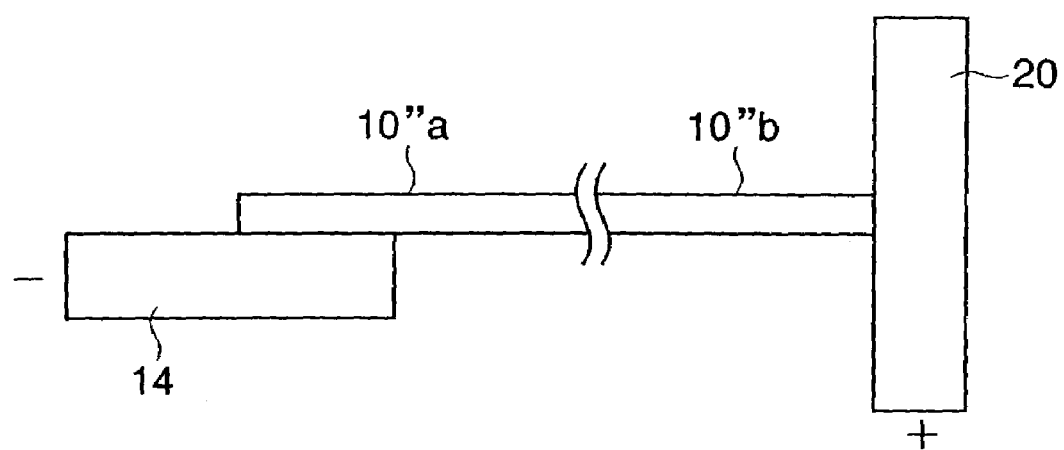
FIG. 10 is a schematically structural diagram showing the electric part shown in FIGS. 7 to 9.
Figure 31:
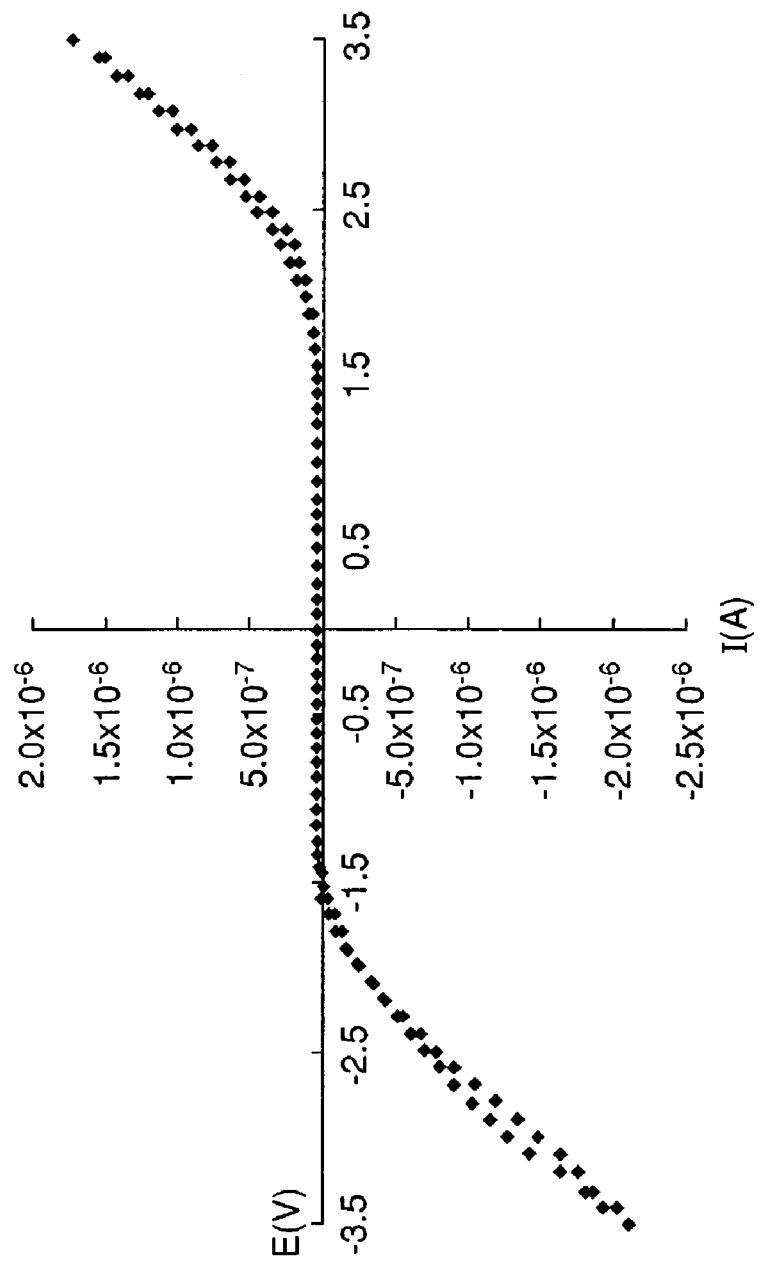
FIG. 31 is a graph exhibiting a measured result of a current-to-voltage characteristic in an electric part in accordance with Comparative Example 4.

The measurement of the current-to-voltage characteristic is conducted on the electric part of this comparative example in the same manner as that of Example 3. A graph exhibiting the measured results is shown in FIG. 31. As shown in FIG. 31, in the case where positive and negative voltages are applied, when the absolute value of the voltage becomes 1.5 V or more, currents start to flow, respectively, with the result that a sufficient rectification characteristic does not appear. It is considered that this is because when the second electrode layer 120 is formed in a state where the agglomerate of the carbon nanotube is exposed on the surface X", the agglomerate is connected directly to the electrode layer 120, and not only the end surfaces of the carbon nanotube but also the side surface thereof are connected with the electrode, whereby the structure of the present invention which is schematically shown in FIG. 10 is not obtained, and the rectification characteristic does not appear.

What is claimed is:

1. A method of manufacturing an electric part, comprising:
    sealing a carbon nanotube group including at least one of a carbon nanotube and a plurality of carbon nanotubes that are electrically connected to each other in a nonconductive base member;
    forming an electrode which is electrically connected to a side surface of at least one carbon nanotube included in the carbon nanotube group; and
    cutting the at least one carbon nanotube included in the carbon nanotube group together with the nonconductive base member to obtain a cut surface.

2. The method of manufacturing an electric part according to claim 1, wherein:
    the nonconductive base member is formed by at least one of a sheet-shaped and a plate-shaped nonconductive substrate and a nonconductive base member layer formed on a surface of the substrate; and
    the sealing includes arranging the carbon nanotube group on the substrate surface, and forming the base member layer that covers and seals the overall carbon nanotube group.

3. The method of manufacturing an electric part according to claim 2, wherein the forming of an electrode includes forming the electrode on the substrate surface to a layer.

4. The method of manufacturing an electric part according to claim 2, wherein the nonconductive base member layer is made of a resin material.

5. The method of manufacturing an electric part according to claim 2, wherein the arranging step includes arranging the carbon nanotube group by coating a dispersion solution resulting from dispersing the carbon nanotube in a dispersion medium on a desired region and drying the dispersion solution.

6. The method of manufacturing an electric part according to claim 5, wherein the dispersion medium includes at least one of water and alcohol.

7. The method of manufacturing an electric part according to claim 6, wherein the dispersion medium further includes a surface active agent.

8. The method of manufacturing an electric part according to claim 1, further comprising forming a second electrode layer on the cut surface subsequent to the cutting step.

9. The method of manufacturing an electric part according to claim 8, wherein a volume resistance of the nonconductive base member is from $1\times10^7$ Ωcm to $1\times10^{15}$ Ωcm.

10. The method of manufacturing an electric part according to claim 8, wherein the electrode is made of any one material selected from a group consisting of metal, semiconductor, and conductive organic high polymer.

11. The method of manufacturing an electric part according to claim 8, wherein the electrode is made of any one material selected from a group consisting of Au, Pt, Ag, Si, GaAs, InP, GaN, polypyrrole, and polyaniline.

12. The method of manufacturing an electric part according to claim 8, wherein the second electrode layer is made of any one material selected from a group consisting of metal, semiconductor, and conductive organic high polymer.

13. The method of manufacturing an electric part according to claim 8, wherein the second electrode layer is made of any one material selected from a group consisting of Au, Pt, Ag, Si, GaAs, InP, GaN, polypyrrole, and polyaniline.

14. The method of manufacturing an electric part according to claim 8, wherein at least one of a diamond knife and a sapphire knife is employed in the cutting.

15. The method of manufacturing an electric part according to claim 1, wherein a cut portion in the cutting step is in a region where the electrode is not formed.

16. The method of manufacturing an electric part according to claim 1, wherein:
   the electrode is made of a metal material that can form a nonconductive oxide layer due to oxidation; and
   a cut portion in the cutting step is a region where the electrode is formed.

17. The method of manufacturing an electric part according to claim 1, wherein a volume resistance of the nonconductive base member is from $1\times10^7$ Ωcm to $1\times10^{15}$ Ωcm.

18. The method of manufacturing an electric part according to claim 1, wherein the nonconductive base member is made of a resin material.

19. The method of manufacturing an electric part according to claim 1, wherein the electrode is made of any one material selected from a group consisting of metal, semiconductor, and conductive organic high polymer.

20. The method of manufacturing an electric part according to claim 1, wherein the electrode is made of any one material selected from a group consisting of Au, Pt, Ag, Si, GaAs, InP, GaN, polypyrrole, and polyaniline.

21. The method of manufacturing an electric part according to claim 1, wherein at least one of a diamond knife and a sapphire knife is employed in the cutting.

* * * * *